United States Patent
Sanpei et al.

(10) Patent No.: US 7,690,817 B2
(45) Date of Patent: Apr. 6, 2010

(54) ILLUMINATION DEVICE WITH SEMICONDUCTOR LIGHT-EMITTING ELEMENTS

(75) Inventors: Tomohiro Sanpei, Yokosuka (JP); Yumiko Hayashida, Yokosuka (JP); Masahiro Izumi, Fujisawa (JP); Kiyoshi Otani, Yokosuka (JP); Yutaka Honda, Yokohama (JP); Shinji Nogi, Tokyo (JP)

(73) Assignee: Toshiba Lighting & Technology Corporation, Tokyo (JP)

( * ) Notice: Subject to any disclaimer, the term of this patent is extended or adjusted under 35 U.S.C. 154(b) by 93 days.

(21) Appl. No.: 11/947,075

(22) Filed: Nov. 29, 2007

(65) Prior Publication Data
US 2008/0128739 A1 Jun. 5, 2008

(30) Foreign Application Priority Data

| Nov. 30, 2006 | (JP) | 2006-324606 |
| Dec. 27, 2006 | (JP) | 2006-353468 |
| Mar. 22, 2007 | (JP) | 2007-075637 |
| Mar. 22, 2007 | (JP) | 2007-075638 |
| Mar. 27, 2007 | (JP) | 2007-082882 |
| Sep. 26, 2007 | (JP) | 2007-250227 |

(51) Int. Cl.
*F21V 29/00* (2006.01)
(52) U.S. Cl. .................. 362/294; 362/249.02; 362/267
(58) Field of Classification Search .................. 362/84, 362/231, 249.02, 267, 293, 294, 800; 257/98, 257/99, 100
See application file for complete search history.

(56) References Cited

U.S. PATENT DOCUMENTS

| 6,936,855 | B1 | 8/2005 | Harrah |
| 2001/0030866 | A1* | 10/2001 | Hochstein .................... 362/800 |
| 2003/0189830 | A1 | 10/2003 | Sugimoto et al. |
| 2004/0065894 | A1 | 4/2004 | Hashimoto et al. |
| 2005/0135105 | A1 | 6/2005 | Teixeira et al. |
| 2007/0252166 | A1* | 11/2007 | Chang et al. .................. 257/98 |
| 2008/0019133 | A1* | 1/2008 | Kim et al. .................... 362/294 |

FOREIGN PATENT DOCUMENTS

JP 2002-94122 3/2002

OTHER PUBLICATIONS

European Search Report issued in counterpart European Application No. 07 25 4612, mailed Apr. 3, 2008.
English Abstract of JP-2002-94122, Mar. 29, 2002.

* cited by examiner

*Primary Examiner*—Y My Quach Lee
(74) *Attorney, Agent, or Firm*—DLA Piper US LLP

(57) ABSTRACT

An illumination device includes a base board, an insulator, a conductor, a plurality of semiconductor light-emitting elements and a light-transmissive sealing member. The base board includes a surface and projection portions. The projection portion is formed to become gradually thicker from its end toward the surface of the base board. The insulator is formed on the surface. The conductor is formed on the insulator. The semiconductor light-emitting elements are mounted on the projection portions. The semiconductor light-emitting elements are electrically connected to the conductor via connection members. The sealing member covers the insulator, the projection portions, the semiconductor light-emitting elements and the connection members.

15 Claims, 15 Drawing Sheets

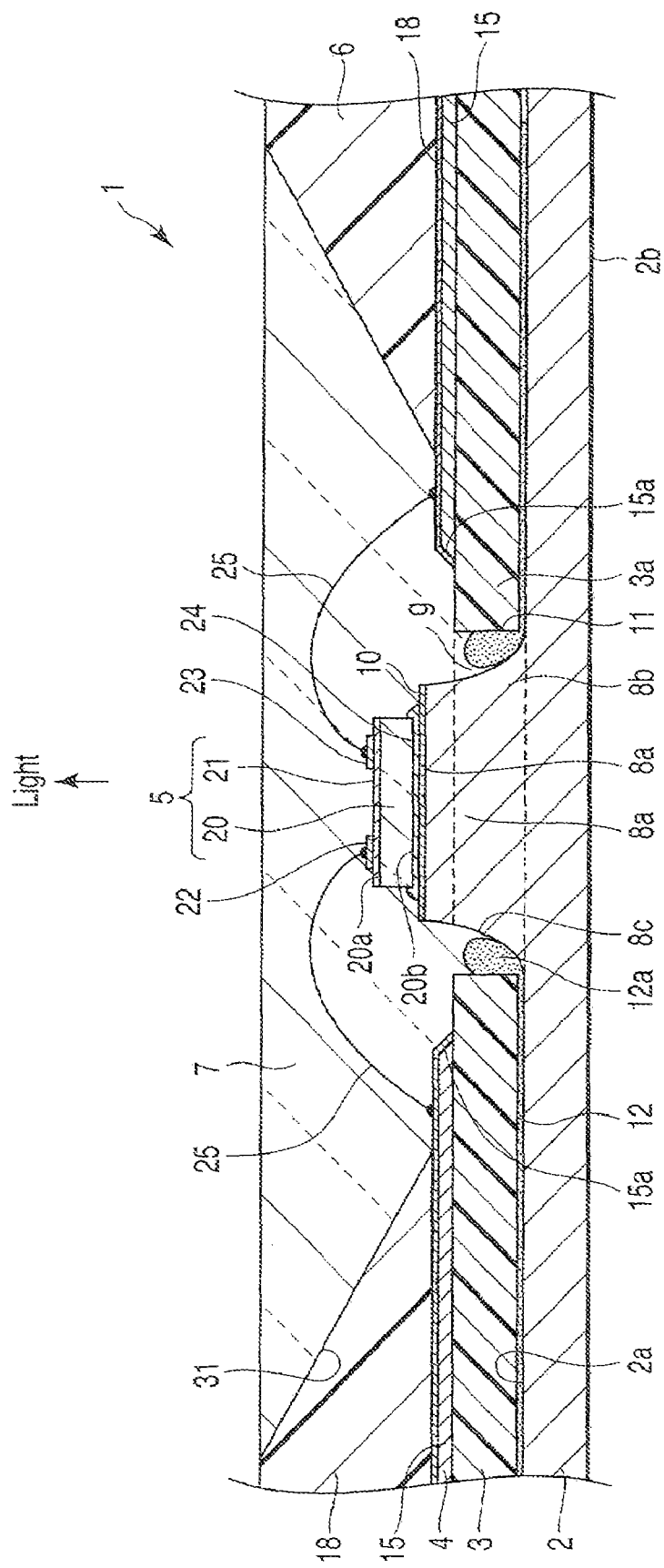
F I G. 6

ILLUMINATION DEVICE WITH SEMICONDUCTOR LIGHT-EMITTING ELEMENTS

CROSS-REFERENCE TO RELATED APPLICATIONS

This application is based upon and claims the benefit of priority from prior Japanese Patent Applications No. 2006-324606, filed Nov. 30, 2006; No. 2006-353468, filed Dec. 27, 2006; No. 2007-075637, filed Mar. 22, 2007; No. 2007-075638, filed Mar. 22, 2007; No. 2007-082882, filed Mar. 27, 2007; and No. 2007-250227, filed Sep. 26, 2007, the entire contents of all of which are incorporated herein by reference.

BACKGROUND OF THE INVENTION

1. Field of the Invention

The present invention relates to an illumination device which uses, as light sources, a plurality of semiconductor light-emitting elements such as light-emitting diode chips.

2. Description of the Related Art

Jpn. Pat. Appln. KOKAI Publication No. 2002-94122 discloses an illumination device in which a plurality of light-emitting diode chips are arranged on a base board. In this illumination device, in order to achieve enhancement of light emission efficiency, an increase in light output and elongation in lifetime, heat that is produced by the light-emitting diode chips is made to quickly escape to the base board, thereby enhancing heat radiation properties.

To be more specific, the base board is formed of a metallic material with excellent heat conductivity, such as aluminum. The base board has a flat mounting surface and a plurality of columnar projection portions which project from the mounting surface. An insulation member is stacked on the mounting surface of the base board. The insulation member has recesses at positions corresponding to the projection portions. Through holes, which penetrate the insulation member, are formed at bottoms of the recesses. The projection portions of the base board are put in the through holes. A distal end face of each projection portion is located at the bottom of the recess. A light-emitting diode chip is bonded to the distal end face of each projection portion. Thereby, the light-emitting diode chip is thermally connected to the distal end face of each projection portion.

A wiring pattern is formed on the insulation member. The wiring pattern has a plurality of terminal portions which are located at the bottoms of the recesses. The terminal portions of the wiring pattern and a pair of electrodes of the light-emitting diode chip are electrically connected via bonding wires.

Further, a sealing member is filled in the recesses of the insulation member. The sealing member is formed of a light-transmissive resin. A phosphor is mixed in the sealing member. The sealing member covers the light-emitting diode chips, wiring pattern and boding wires, and protects connection parts between the bonding wires and the electrodes.

In the conventional illumination device disclosed in the above-described Japanese KOKAI Publication, the light-emitting diode chips which produce heat are thermally connected to the projection portions of the metallic base board. Thus, the heat produced by the light-emitting diode chips can directly be conducted to the base board, and the heat can be radiated from the base board to the outside of the illumination device.

However, in the conventional illumination device, although the temperature rise of the light-emitting diode chip can be suppressed, the extraction of light emitted from the light-emitting diode chips is not adequate. Specifically, part of the light emitted from the light-emitting diode chips is absorbed by the phosphor in the sealing member, and is converted to light of some other color and radiated. At this time, part of the light, which is emitted toward the projection portions of the base board, is reflected by the projection portions and is extracted to the outside of the illumination device.

In the conventional illumination device, when the light is extracted, each projection portion is located inside the through hole of the insulation member, and thus the entire periphery of the projection portion is surrounded by the insulation member. As a result, the light that is radiated from the phosphor can be reflected only by a limited part of the distal end face of the projection portion, which is exposed to the periphery of the light-emitting diode chip. Hence, the use of the light from the light-emitting diode chips is not sufficient, and the brightness may become deficient, for example, when purposes of use for general illumination are assumed.

BRIEF SUMMARY OF THE INVENTION

The object of the present invention is to provide an illumination device which can efficiently extract light while suppressing a temperature rise of semiconductor light-emitting elements.

In order to achieve the object, an illumination device according to claim 1 includes a base board with heat radiation properties, an insulator, a conductor, a plurality of semiconductor light-emitting elements and a light-transmissive sealing member. The base board includes a surface and projection portions formed to become gradually thicker from its ends toward the surface of the base board. The insulator is formed on the surface of the base board. The conductor is formed on the insulator. The semiconductor light-emitting elements are mounted on the projection portions of the base board. The semiconductor light-emitting elements are electrically connected to the conductor via connection members. The sealing member covers the projection portions, the semiconductor light-emitting elements, the connection members and the conductor.

In one embodiment of the invention, a metallic material or a carbon-based material is usable as the material of the base board. Preferable examples of the metallic material are copper, aluminum and an alloy thereof, which have good heat radiation properties. Examples of the carbon-based material are carbon and graphite. In particular, in the case where carbon-based powder material is used, the carbon-based powder material may be compressed by a mold, and thereby the base board can be formed. Hence, when the projection portions are formed on the base board, there is no need to subject the base board to etching treatment. Therefore, the base board with the projection portions can easily be formed in a desired shape. Moreover, by choosing the carbon-based material as the material of the base board, the influence of recent steep rise in price of copper can be eliminated, and the increase in cost of the base board can advantageously be suppressed. The projection portions can also be formed by laser processing or machining.

In the case where the base board is metallic, it is preferable to set the thickness of that part of the base board, which is covered with the insulator, at 0.25 mm to 0.50 mm. Thereby, the precision in thickness dimension of the base board can be improved. In addition, when bonding wires are used as the connection members, the variance in strength of connection parts between the bonding wires and the conductor can be more reduced as the precision in thickness of the base board becomes higher. Therefore, the reliability of connection between the bonding wires and the conductor can be enhanced.

A glass epoxy plate, for instance, is usable as the insulator. In order to obtain good light reflection performance, it is preferable to use a white glass epoxy plate. In the case where the white glass epoxy plate is used as the insulator, light emitted from the semiconductor light-emitting elements is not absorbed by the insulator and is reflected by the insulator. Thus, advantageously, light can efficiently be extracted.

The conductor is formed of a metallic material with good electrical conductivity, such as copper or silver. In the case where the base board is metallic, the conductor can be formed, by etching, on that surface of the insulator, which is opposite to the base board. Alternatively, for example, the conductor may be attached to the insulator via an adhesive.

Furthermore, a resist layer may be stacked on the insulator, and the conductor may be covered with the resist layer. According to this structure, the insulation properties and anti-migration properties of the conductor can be improved, and the oxidation of the conductor can be prevented.

A blue LED chip which emits blue light or an LED chip which emits ultraviolet, for instance, is usable for the semiconductor light-emitting elements. Moreover, at least two kinds of LED chips, which are chosen from a blue LED chip, a red LED chip and a green LED chip, may be used in combination. For example, in an illumination device which obtains white emission light by using the blue LED chip as the light source, a sealing member, in which a phosphor that is excited by blue light and mainly emit yellow light are mixed, is used. Furthermore, in the case where the LED which emits ultraviolet is used as the light source, it is possible to use a sealing member which contains a phosphor that is excited by ultraviolet and mainly emit red light, a phosphor that are excited by ultraviolet and mainly emit green light, and a phosphor that is excited by ultraviolet and mainly emit yellow light.

A bonding material, for instance, is used when the semiconductor light-emitting element is mounted on the projection portion of the base board. Preferably, the thickness of the bonding material should be set at 10 μm or less within such a range as not to lose the inherent adhesion function of the bonding material. In addition, in order to efficiently extract light, it is preferable to choose a bonding material with light transmissivity, and to reflect part of the light, which is emitted from the semiconductor light-emitting element, by the projection portion.

The sealing member shields the semiconductor light-emitting elements from outside air and moisture, thereby preventing a decrease in lifetime of the semiconductor light-emitting elements. Light-transmissive synthetic resins, such as epoxy resin, silicone resin and urethane resin, are usable for the sealing member. Further, instead of the light-transmissive synthetic resin, a transparent low-melting-point glass, for example, can be used for the sealing member.

According to one embodiment of the invention, power is supplied to the semiconductor light-emitting elements via the conductor and the connection members, thereby causing the semiconductor light-emitting elements to emit light. The light radiated from the semiconductor light-emitting elements is extracted through the sealing member to the side opposite to the base board. The insulator, which effects electrical insulation between the conductor and the base board, is not present between the projection portions of the base board and the semiconductor light-emitting elements, and the semiconductor light-emitting elements are mounted on the projection portions. Thus, when the semiconductor light-emitting elements are lighted, the heat that is produced by the semiconductor light-emitting elements is directly conducted to the projection portions, without being shielded by the insulator.

In addition, since the cross-sectional area of the projection portion gradually increases from the end of the projection portion toward the base board, the thermal conduction from the semiconductor light-emitting element to the base board becomes easier. As a result, the heat of the semiconductor light-emitting elements is efficiently conducted to the base board and is radiated from the base board to the outside of the illumination device. Therefore, the temperature rise of the semiconductor light-emitting elements can surely be prevented.

Furthermore, the projection portions, on which the semiconductor light-emitting elements are mounted, penetrate the insulator. Thus, part of the light, which is radiated from the semiconductor light-emitting elements, travels towards the projection portions without being blocked by the insulator. Since each projection portion flares from the end thereof toward the surface of the base board, the light that is incident on the projection portion can positively be reflected in the light-extraction direction opposite to the base board. Therefore, the light emitted from the semiconductor light-emitting elements can efficiently be extracted by making use of the projection portions that facilitate the heat radiation of the semiconductor light-emitting elements.

In one embodiment of the invention, the outer peripheral surface of the projection portion flares from a distal end face of the projection portion toward the base board. The outer peripheral surface of the projection portion may not flare continuously, but may flare stepwise. According to this structure, part of the light emitted from the semiconductor light-emitting element can be reflected in the light-extraction direction by making use of the inclination of the outer peripheral surface of the projection portion.

In one embodiment of the invention, the insulator has a plurality of through holes, through which the projection portions penetrate, and each of the through holes has a greater diameter than the projection portion. According to this structure, when the insulator is stacked on the base board, the projection portions penetrate the through holes. Therefore, the alignment between the base board and the insulator can easily be performed. In addition, interference between the insulator and the projection portions can be prevented, and the insulator does not lift from the surface of the base board. Therefore, the insulator can be stacked on a proper position on the surface of the base board.

In one embodiment of the invention, the insulator is bonded to the surface of the base board via the adhesive. A part of the adhesive protrudes to the inside of the through hole. The adhesive, which is usable, may be in a paste form or in a sheet form. The adhesive is disposed on that region of the base board, which excludes the projection portions.

According to this structure, the entire region between the base board and the insulator can be filled with the adhesive, and no gap, which is continuous with the through hole, occurs between the base board and the insulator. Therefore, when the sealing member is heated, it is possible to prevent air, which remains in the gap, from becoming bubbles and flowing into the inside of the sealing member. In other words, it is possible to avoid such a situation that the air in the gap becomes bubbles and stays within the sealing member.

In one embodiment of the invention, the adhesive, which protrudes into the through hole, should preferably reach the same height as the surface of the insulator. Thereby, since most of the gap between the through hole and the projection portion is filled with the adhesive, air hardly remains between the through hole and the projection portion, for example, when the non-solidified resin material, of which the sealing member is to be formed, is filled in the surrounding region of the projection portion.

Moreover, bonding between the projection portion and the insulator can be effected by the adhesive that protrudes into the through hole. As a result, the strength of adhesion of the insulator to the base board can be improved. Besides, since the adhesive that protrudes functions as an electrical insulator, electrical insulation between the conductor that is provided on the insulator and the projection portion can advantageously be secured.

Preferably, the adhesive should be milk white, or white. Thereby, part of the light that is emitted from the semiconductor light-emitting elements can be reflected by the adhesive, which protrudes into the through hole, in the light-extraction direction opposite to the base board. Therefore, the adhesive that protrudes into the through hole effectively contributes to more efficient extraction of light.

In one embodiment of the invention, a light reflective layer is formed on the distal end face of each projection portion, and the semiconductor light-emitting element is bonded to the light reflective layer via a light-transmissive bonding material.

Preferably, the light reflective layer should be formed of, for example, a silver plating layer. Since the silver plating layer does not hinder heat conduction from the semiconductor light-emitting element to the projection portion, the heat of the semiconductor light-emitting elements can efficiently be let to escape to the projection portions. Besides, the silver plating layer has a light reflectance of 90% or more. Thus, the light, which is made incident on the silver plating layer through the light-transmissive bonding material, can efficiently be reflected in the light-extraction direction.

A light-transmissive synthetic resin, such as transparent silicone resin, or frit glass is usable as the bonding material. There is very little possibility that the transparent silicone resin deteriorates with a change in color due to heat. Thus, with the use of the transparent silicone resin as the bonding material, the bonding material does not shield light that is incident on the light reflective layer, or hinder extraction of light that is reflected by the light reflective layer. Therefore, extraction of light can efficiently be performed for a long time.

In one embodiment of the invention, a side light reflective layer is formed on the outer peripheral surface of each projection portion. The side light reflective layer is continuous with the light reflective layer, and with a part of the adhesive that protrudes into the through hole. Further, the sealing member includes a phosphor which is excited by light emitted from the semiconductor light-emitting elements.

It is preferable that the side light reflective layer be formed of a metallic plating layer of the same kind as the light reflective layer of the projection portion. Thereby, a major part of the projection portion can be used as a light reflective surface. According to this structure, when the phosphor in the sealing member is excited, light is emitted from the phosphor. Part of the emitted light is incident on the side light reflective layer on the outer peripheral surface of the projection portion. As a result, the light from the phosphor can efficiently be reflected in the light-extraction direction by making use of the side light reflective surface.

In one embodiment of the invention, the dimension of protrusion of the adhesive into the through hole is 0.2 mm or less. With this structure, despite the adhesive being continuous with the side light reflective layer, a decrease in area of the side light reflective layer becomes practically ignorable. In addition, even if the adhesive is colored, for example, in brown or black, the light absorption function of the protruding adhesive becomes very weak and substantially ignorable. Therefore, the adhesive that protrudes into the through hole does not adversely affect the extraction of light.

In one embodiment of the invention, when the light reflectance of the insulator is made different from the light reflectance of the adhesive, it is preferable to make the light reflectance of the adhesive lower than the light reflectance of the insulator. For example, in the case where the insulator is white, it is preferable to make the adhesive brown or black. Thereby, a sharp difference in color can be given between the insulator and the adhesive. As a result, the position of the through hole of the insulator can easily be recognized by using, for example, an imaging camera, and the semiconductor light-emitting element can be mounted on the projection portion by using the position of the through hole as a reference.

In one embodiment of the invention, the adhesive is transparent. If the adhesive is transparent, the color of the base board is recognized through the adhesive that protrudes into the through hole. Accordingly, the color of the base board is different from the color of the surrounding part of the through hole of the insulator. Thus, the position of the through hole can easily be recognized on the basis of the boundary between the insulator and the adhesive that protrudes into the through hole. Therefore, when the semiconductor light-emitting element is mounted on the projection portion that penetrates the through hole, the reference for determining the position of the semiconductor light-emitting element, relative to the projection portion, can surely be obtained.

One embodiment of the invention further includes a resist layer which is stacked on the insulator and the conductor. The resist layer has a plurality of openings in which the semiconductor light-emitting elements and connection parts between the connection members and the conductor are located, and the sealing member individually covers the openings.

The resist layer may be formed of a transparent or a colored synthetic resin. In particular, it is preferable to use a white synthetic resin having a light reflectance of 80% or more. The white resist layer can reflect the light, which is emitted from the semiconductor light-emitting element, in the light-extraction direction opposite to the base board, and, advantageously, the light can efficiently be extracted. Although it is preferable that the shape of the opening of the resist layer be circular, this opening may have an angular shape.

In one embodiment of the invention, the amount of the sealing member that is used can be reduced, compared to the case in which the sealing member is filled so as to continuously cover all the semiconductor light-emitting elements and conductor. Moreover, in the case where the sealing member is formed by dispensing the non-solidified resin in the opening, the flow of the non-solidified resin can be stemmed by the opening edge of the opening until the non-solidified resin is solidified. Thus, the non-solidified resin can be prevented from spreading over the surface of the resist layer, and the height of rising of the sealing member can properly be determined.

One embodiment of the invention further includes a frame member which surrounds the semiconductor light-emitting elements, and an adhesive which is interposed between the frame member and the insulator. The adhesive contains a thermosetting adhesive resin and the adhesive bonds the frame member to the insulator. The sealing member is filled in a region which is surrounded by the frame member.

Preferably, the inner surface of the frame member should be formed as a light reflective surface. The frame member, whose inner surface is the light reflective surface, serves also as a reflector which reflects light that is emitted from the semiconductor light-emitting elements. The light reflective surface can be obtained by stacking a light reflective layer on the inner surface of the frame member, or by forming the frame member itself in white. The light reflective layer can be formed by evaporation-depositing or plating a metal with a high light reflectance, such as aluminum or nickel, on the inner surface of the frame member, or by coating a white paint on the inner surface of the frame member. In order to form the frame member itself in white, for example, white powder may be mixed in the resin, of which the frame member is to be formed. An example of white powder, which is usable, is a white filler such as aluminum oxide, titanium oxide, magnesium oxide or barium sulfate.

For example, a light-transmissive resin, such as transparent epoxy resin or transparent silicone resin, is usable as the sealing member. A phosphor, which wavelength-convert light that is emitted from the semiconductor light-emitting element to light of a different color, may be mixed in this resin.

In one embodiment of the invention, the adhesive is heated in the state in which the adhesive is pressed between the insulator of the base board and the frame member. Thus, the adhesive resin, which is filled between the insulator and the frame member, is solidified. Thereby, the frame member is fixed to the insulator via the adhesive.

According to one embodiment of the invention, the sealing member is filled in the region surrounded by the frame member. Thereby, all the semiconductor light-emitting elements, which are disposed on the base board, can be sealed at a time. Moreover, since the adhesive contains the adhesive resin, a work of coating an adhesive on the frame member is needless, and there is no need to manage the amount of coating of the adhesive.

In one embodiment of the invention, the conductor includes a plurality of terminal portions which are arranged at intervals. Each of the terminal portions includes a land part for power supply and a connection part which connects the land part and the conductor, and the connection part has a smaller width than the land part. The frame member crosses over the connection parts of the terminal portions.

A power cable is connected to the land part of each terminal portion by means of, e.g. soldering. Thus, in order to secure the reliability of soldering, the width of the land part should preferably be set at, e.g. 1.0 mm or more. The connection part of the terminal portion is integral with the land part, and includes an extension part that protrudes into the inside of the frame member. The width of the extension part may be equal to, or different from, the width of the connection part. Further, the position of connection of the connection part to the land part may be a central area in the width direction of the land part, or may be an end area of the land part which deviates from the center of the land part.

According to one embodiment of the invention, the width of the connection part of the terminal portion, over which the frame member crosses, is smaller than the width of the land part. Thereby, the interval between the neighboring connection parts can be increased. As a result, when the adhesive is pressed between the base board and the frame member, the adhesive deforms and easily enters between the neighboring connection parts.

In one embodiment of the invention, the width of the connection part is in a range of between 0.1 mm to less than 1.0 mm, and an interval between the neighboring connection parts is 0.2 mm or more. By this setting, the adhesive can easily enter between the neighboring connection parts, and the adhesive can surely be filled between the connection parts.

In one embodiment of the invention, the thickness of the conductor is 20 μm or less. By this setting, the surface of the insulator including the conductor is flat with little roughness. Accordingly, the adhesive can easily come in close contact with the surface of the insulator, and the adhesive can easily enter every part and corner between the neighboring connection parts.

According to one embodiment of the invention, the adhesive resin includes protrusion portions protruding inside the frame member. The protrusion portions cover corner parts defined by the insulator and portions of the frame member crossing over the connection parts, and the sealing member covers the protrusion portions.

According to this structure, minute gaps, which communicate the inside and outside of the frame member, are prevented from occurring at the corner parts. In addition, even if minute gaps occur at the corner parts, the gaps can be sealed with the adhesive and prevented from communicating with the inside of the frame member.

In one embodiment of the invention, the sealing member includes a plurality of light emission sections and grooves located between the light emission sections. The grooves divide the neighboring light emission sections and absorb expansion/contraction force due to the thermal expansion or thermal contraction of the sealing member. Hence, even when the sealing member receives the heat of the semiconductor light-emitting elements and expands/contracts, the expansion/contraction of the sealing member is hardly transmitted to the base board. In addition, the expansion/contraction force, which occurs in each light emission section, hardly affects the neighboring light emission sections, and does not increase the warp or distortion of other light emission sections. Therefore, non-uniformity in color between the light emission sections can be reduced and suppressed.

In one embodiment of the invention, each of the grooves includes a bottom part which connects the neighboring light emission sections. The bottom part of the groove prevents deformation of the sealing member due to blow-hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a cross-sectional view of an illumination device according to a second embodiment of the invention;

DETAILED DESCRIPTION OF THE INVENTION

A first embodiment of the present invention will now be described with reference to FIG. 1 to FIG. 5.

Figure 1:
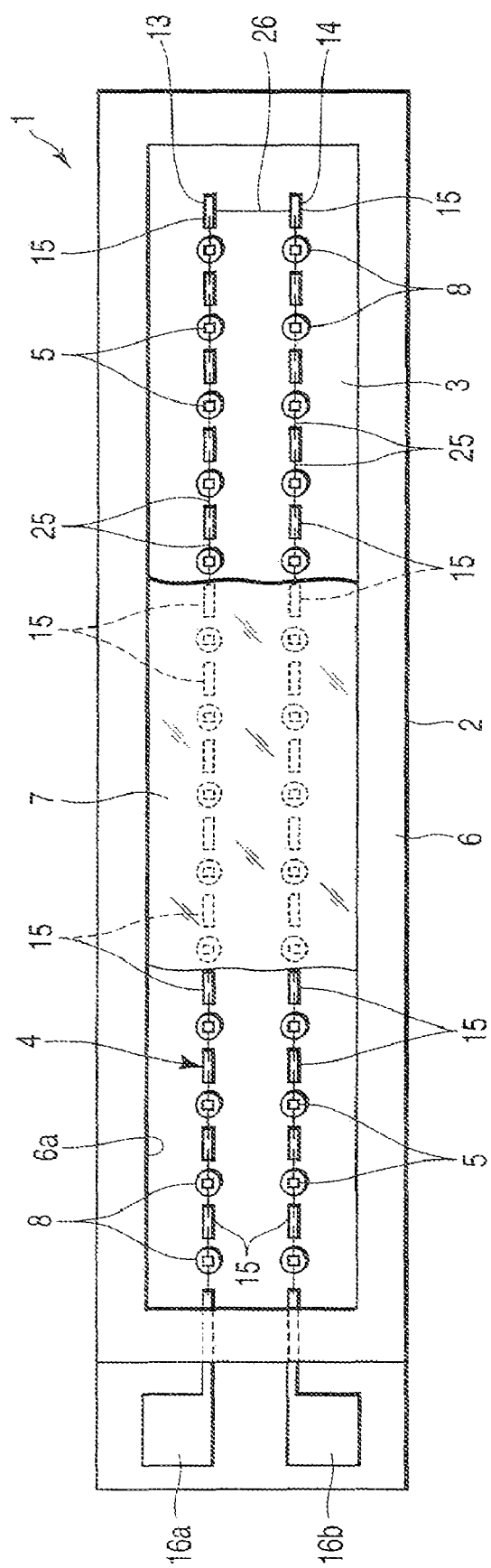
FIG. 1 is a partly cut-out plan view showing an illumination device according to a first embodiment of the present invention.

FIG. 1 discloses an illumination device 1 which constitutes, for example, an LED package. The illumination device 1 includes a base board 2, an insulator 3, a conductor 4, a plurality of semiconductor light-emitting elements 5, a reflector 6 and a sealing member 7.

Figure 2:
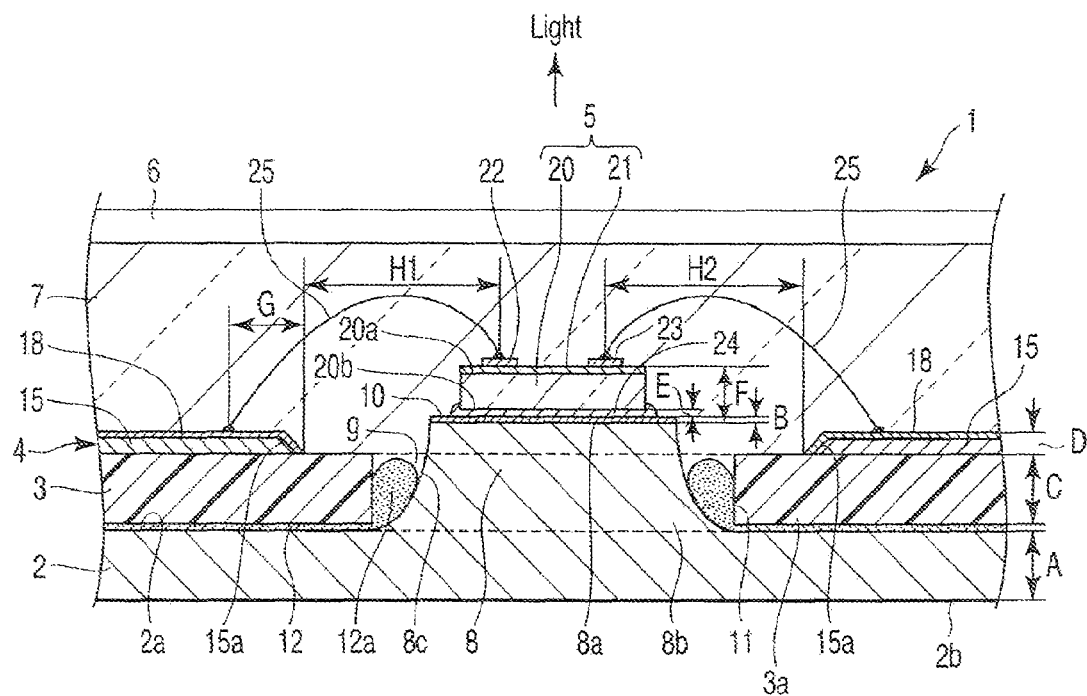
FIG. 2 is a cross-sectional view of the illumination device according to the first embodiment of the invention, showing a positional relationship between a semiconductor light-emitting element which is bonded to a distal end face of a projection portion, an insulator, a conductor and a sealing member.

The base board 2 has, for example, a rectangular shape in order to obtain a light emission area that is required by the illumination device 1. The material of the base board 2 should preferably be a metal with good heat radiation properties, such as copper or an aluminum alloy. As shown in FIG. 2, the base board 2 has a front surface 2a and a back surface 2b which is located opposite to the front surface 2a. A plurality of columnar projection portions 8 are integrally formed on the front surface 2a of the base board 2. The number of projection portions 8 corresponds to the number of semiconductor light-emitting elements 5.

The thickness A of that part of the base board 2, which excludes the projection portions 8, is, e.g. 0.25 mm. The back surface 2b of the base board 2 is used as a heat radiation surface, or a heat conduction surface which is thermally connected to a heat sink.

As shown in FIG. 2, the projection portion 8 has a flat distal end face 8a. The distal end face 8a of the projection portion 8 is parallel to the front surface 2a of the base board 2. The projection portion 8 is formed to be thicker at a proximal portion 8b thereof, which is continuous with the front surface 2a of the base board 2, than at the distal end face 8a thereof. In the present embodiment, the projection portion 8 is formed to become gradually thicker from the distal end face 8a toward the proximal portion 8b. In other words, the cross-sectional area of the projection portion 8a in its diametrical direction increases continuously from the distal end face 8a toward the proximal portion 8b. Accordingly, the projection portion 8 has a tapered outer peripheral surface 8c which flares from the distal end face 8a toward the proximal portion 8b. The outer peripheral surface 8c of the projection portion 8 is continuous with the front surface 2a of the base board 2, describing a gentle arcuate curve. According to the present embodiment, the diameter of the distal end face 8a is, e.g. 0.57 mm, and the diameter of the proximal portion 8b is, e.g. 1.08 mm.

A light reflective layer 10 is stacked on the distal end face 8a of the projection portion 8. The light reflective layer 10 is formed of a thin film of, e.g. silver, and the thickness B thereof is 0.003 mm to 0.005 mm. The light reflectance of the light reflective layer 10 is 90% or more.

Figure 3:
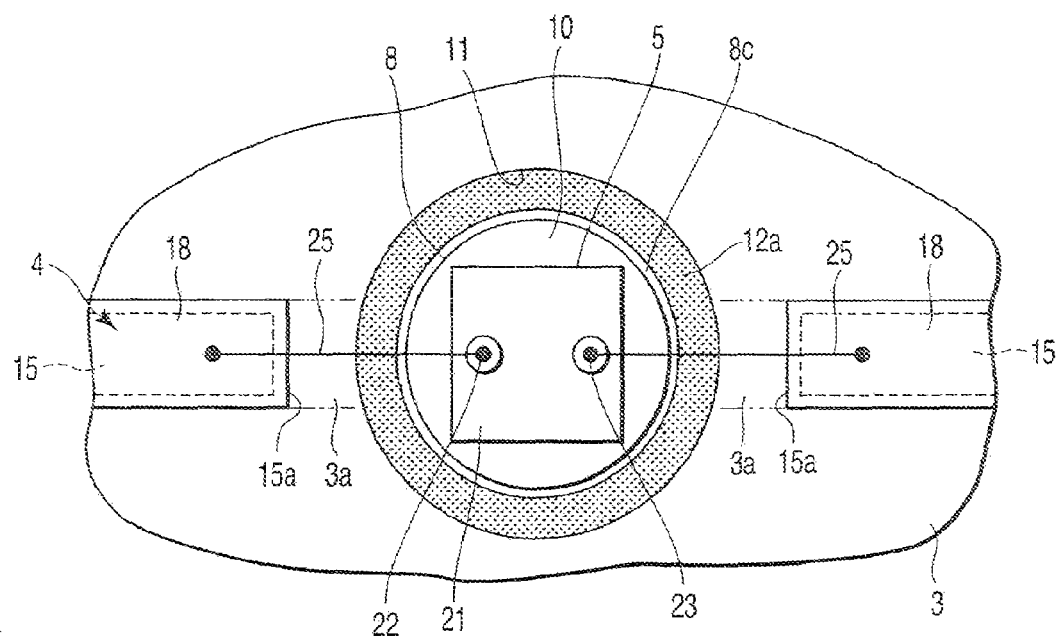
FIG. 3 is a plan view showing the positional relationship between the semiconductor light-emitting element which is bonded to the distal end face of the projection portion, the insulator and the conductor in the first embodiment of the invention.

A white glass epoxy base plate, for instance, is used as the insulator 3 in order to obtain a light reflecting performance. The thickness C of the insulator 3 may be 0.060 mm at minimum, and is, e.g. 0.25 mm in this embodiment. As shown in FIG. 1 and FIG. 3, the insulator 3 includes a plurality of through holes 11, through which the projection portions 8 penetrate. The through hole 11 has a circular shape, for instance, and its diameter is greater than the diameter of the proximal portion 8b that is the thickest part of the projection portion 8. The number of through holes 11 agrees with the number of projection portions 8.

The insulator 3 is not limited to a single layer, and may formed of two layers. In the case where the insulator 3 is formed of two layers, it is possible that two glass epoxy base plates each having a thickness of 0.030 mm can be stacked. The two-layer insulator 3 can have a more dielectric strength than the single-layer insulator 3.

The insulator 3 is attached to the front surface 2a of the base board 2 via an adhesive layer 12. The adhesive layer 12 is formed by impregnating a sheet of fibrous material, such as paper or cloth, with a thermosetting resin adhesive, and has electrical insulating properties. The adhesive layer 12 is interposed between the insulator 3 and the base board 2 and has a plurality of holes, through which the projection portions 8 penetrate. The diameter of each hole is greater than the diameter of the proximal portion 8b of the projection portion 8. The thickness of the adhesive layer 12 should preferably be, e.g. 0.005 mm or less.

In the state in which the insulator 3 is attached to the front surface 2a of the base board 2, the projection portions 8 of the base board 2 coaxially penetrate the through holes 11 of the insulator 3. In other words, the insulator 3 is stacked on that area of the front surface 2a of the base board 2, which excludes the projection portions 8. Thereby, the projection portions 8 are exposed to the outside of the insulator 3 through the through holes 11.

Since each of the through hole 11 of the insulator 3 has a greater diameter than the proximal portion 8b of the projection portion 8, the insulator 3 can be prevented from interfering with the projection portions 8 when the insulator 3 is stacked on the front surface 2a of the base board 2. Thus, the insulator 3 does not lift from the front surface 2a of the base board 2. Therefore, the insulator 3 properly overlaps the front surface 2a, and the position of the insulator 3, relative to the base board 2, is fixed. In other words, by overlapping the insulator 3 on the front surface 2a of the base board 2 so as to prevent interference between the through holes 11 of the insulator 3 and the projection portions 8, the insulator 3 can be stacked at a proper position on the front surface 2a.

When the insulator 3 is attached to the base board 2 by using the adhesive layer 12, the insulator 3 is pressed toward the base board 2. Thereby, the adhesive layer 12 is clamped between the base board 2 and the insulator 3, and an excess portion of the adhesive is pushed out into the inside of the through hole 11. More exactly, an excess portion 12a of the adhesive is pushed out and stays in an annular gap g between the outer peripheral surface 8c of the projection portion 8 and the through hole 11. The excess portion 12a of the adhesive hardens in the state in which the excess portion 12a spreads between the outer peripheral surface 8c of the projection portion 8 and the insulator 3.

Thereby, the insulator 3 is also attached to the projection portions 8, and the strength of adhesion of the insulator 3 to the base board 2 is increased. Moreover, the excess portion 12a of the adhesive functions as an insulator having a volume resistivity of $10^{-2}$ to $10^{-15}\Omega\cdot m$. As a result, the withstand voltage between the insulator 3 and the outer peripheral surface 8c of the projection portion 8 is improved.

The conductor 4 is an electrical conduction element for electrically connecting a plurality of semiconductor light-emitting elements 5. The conductor 4 is formed of a copper foil, and is formed, by etching, on that surface of the insulator 3, which is opposed to the base board 2, before stacking the insulator 3 on the base board 2.

As shown in FIG. 1, the conductor 4 includes a first conductor string 13 and a second conductor string 14. The first and second conductor strings 13 and 14 extend in the longitudinal direction of the base board 2 and are juxtaposed in parallel with a distance therebetween.

The first conductor string 13 includes a plurality of conductor portions 15 and a first terminal portion 16a. Similarly, the second conductor string 14 includes a plurality of conductor portions 15 and a second terminal portion 16b. The conductor portions 15 are arranged in line at intervals in the longitudinal direction of the base board 2. In the present embodiment, the conductor portions 15 and the through holes 11 of the insulator 3 are alternately arranged with a pitch of, e.g. 4 mm. In other words, the through hole 11, in which the projection portion 8 is passed, is positioned between neighboring conductor portions 15.

The first terminal portion 16a is formed integral with the conductor portion 15 which is located at one end of the first conductor string 13. The second terminal portion 16b is formed integral with the conductor portion 15 which is located at one end of the second conductor string 14. Power cables are electrically connected to the first and second terminal portions 16a and 16b by means of, e.g. soldering.

As shown in FIG. 2, each conductor portion 15 is covered with a light reflective layer 18. The light reflective layer 18 is formed of a silver thin film having a reflectance of 90% or more, and the thickness of the light reflective layer 18 is 0.003 mm to 0.005 mm. The thickness D of the conductor portion 15 including the light reflective layer 18 is 0.012 mm to 0.018 mm. The light reflective layer 18 of each conductor portion 15 and the light reflective layer 10 of each projection portion 8 can be formed at the same time by, for example, electroless plating. Each of the projection portion 8 and conductor portion 15 is formed of copper. Thus, without putting the projection portion 8 and conductor portion 15 in a plating bath, the light reflective layer 10 can be formed on the projection portion 8, and the light reflective layer 18 can be formed on the conductor portion 15. Furthermore, a resist film may be stacked on the light reflective layer 18.

As shown in FIG. 2 and FIG. 3, an end edge 15a of each conductor portion 15 is spaced apart by a predetermined distance from the opening edge of the through hole 11. Thereby, a portion 3a of the white insulator 3 is exposed from between the end edge 15a of each conductor portion 15 and the opening edge of the through hole 11. As a result, a distance for insulation, which is greater than the gap g between the outer peripheral surface 8c of the projection portion 8 and the through hole 11, can be secured between the end edge 15a of each conductor portion 15 and the outer peripheral surface 8c of the projection portion 8. In addition, since the portion 3a of the insulator 3 is exposed from between the end edge 15a of each conductor portion 15 and the opening edge of the through hole 11, light which is incident on the part 3a of the insulator 3 can be reflected in a light-extraction direction opposite to the base board 2. Exactly speaking, the end edge 15a of the conductor portion 15 refers to an end edge of the light reflective layer 18 that covers the conductor portion 15.

A double-wire type blue LED chip which uses, e.g. a nitride semiconductor, is used as each semiconductor light-emitting element 5. The semiconductor light-emitting element 5 includes a light-transmissive substrate 20 and a light-emitting layer 21. A sapphire substrate, for instance, is used as the substrate 20. The substrate 20 has a first surface 20a and a second surface 20b which is located on a side opposite to the first surface 20a. The semiconductor light-emitting layer 21 is formed by successively stacking, on the first surface 20a of the substrate 20, a buffer layer, an n-type semiconductor layer, a light emission layer, a p-type clad layer and a p-type semiconductor layer. The light emission layer has such a quantum well structure that barrier layers and well layers are alternately arranged. The n-type semiconductor layer includes an n-side electrode 22. The p-type semiconductor layer includes a p-side electrode 23. Besides, the semiconductor light-emitting layer 21 has no reflective film, and light can be emitted in both directions along the thickness thereof.

As shown in FIG. 2, the semiconductor light-emitting elements 5 are mounted on the distal end faces 8a of the projection portions 8 that project from the base board 2. Specifically, the second surface 20b of the substrate 20 of each semiconductor light-emitting element 5 is adhered to the distal end face 8a of the projection portion 8 via a bonding material 24. Accordingly, the semiconductor light-emitting elements 5 and the conductor portions 15 are alternately arranged with a pitch of, e.g. 4 mm.

A silicone resin adhesive with light transmissivity should preferably be used as the bonding material 24. The bonding material 24 constitutes a thermal resistance member which hinders heat conduction from the semiconductor light-emitting element 5 to the projection portion 8. However, the thermal resistance of the bonding material 24 can be made substantially ignorable by reducing the thickness E of the bonding material 24 to, e.g. 0.10 mm or less. It is desirable, therefore, to make the thickness E of the bonding material 24 as small as possible within such a range that the inherent adhesion performance of the bonding material would not be lost.

The height of the projection portion 8 including the light reflective layer 10 may be less than the height of the insulator 3 if the light-emitting layer 21 of the semiconductor light-emitting element 5 projects above the semiconductor portion 15 on the insulator 3, as shown in FIG. 2. However, it is preferable to set the height of the projection portion 8 to be equal to or greater than the height of the insulator 3. In the present embodiment, the height of the projection portion 8 is determined such that the light reflective layer 10 is positioned higher than the light reflective layer 18 that covers the conductor portion 15.

The dielectric strength between the semiconductor light-emitting layer 21 of the semiconductor light-emitting element 5 and the projection portion 8 can be secured by the bonding material 24 and the sapphire substrate 20 that is much thicker than the bonding material 24. The thickness of the semiconductor light-emitting element 5 including the bonding material 24 is, e.g. 0.09 mm. With the use of this semiconductor light-emitting element 5, the semiconductor light-emitting layer 21 projects to a position higher than the light reflective layer 18 that covers the conductor portion 15. In this embodiment, the entirety of the semiconductor light-emitting element 5 projects to a position higher than the light reflective layer 18.

If the semiconductor light-emitting element 5 projects to a position higher than the light reflective layer 18, the light, which is emitted from the semiconductor light-emitting element 5 to the periphery thereof, can easily reach the surrounding of the through hole 11, without being blocked by the insulator 3. As a result, the light can be reflected by the surrounding of the semiconductor light-emitting element 5 and can efficiently be extracted to the side opposite to the base board 2.

As shown in FIG. 2 and FIG. 3, each semiconductor light-emitting element 5 is electrically connected to the conductor portions 15 of the conductor 4 by wire bonding. Specifically, the n-side electrode 22 of each semiconductor light-emitting element 5 is electrically connected a neighboring conductor portion 15 via a bonding wire 25. The p-side electrode 23 of the semiconductor light-emitting element 5 is electrically connected another neighboring conductor portion 15 via a bonding wire 25. The bonding wire 25 is an example of a connection member.

That one of the conductor portions 15 of the first conductor string 13, which is located on the side opposite to the first terminal portion 16a, and that one of the conductor portions 15 of the second conductor string 14, which is located on the side opposite to the second terminal portion 16b, are electrically connected via another bonding wire 26 (see FIG. 1). Thus, the plural semiconductor light-emitting elements 5 are connected in series on the base board 2.

When the semiconductor light-emitting element 5 is wire-bonded to the conductor portions 15, one end of the bonding wire 25 is bonded to the electrode 22, 23 by ball bonding. Thereafter, the bonding wire 25 is led to the conductor portion 15 by using a bonding tool, and is bonded to the conductor portion 15. In the present embodiment, since the semiconductor light-emitting element 5 projects to a position higher than the conductor portion 15, the insulator 3 does not hinder the movement of the bonding wire 25 when the bonding wire 25 is moved by using the bonding tool. Moreover, there is no need to forcibly stretch the bonding wire 25 in an obliquely downward direction, and the wire bonding is facilitated.

When the semiconductor light-emitting element 5 is wire-bonded to the conductor portion 15, a bonding machine is made to recognize a boundary between the end edge 15a of the conductor portion 15 and the insulator 3, and the bonding wire 25 is bonded to that part of the conductor portion 15, which is apart from this boundary, or a reference position, by a predetermined distance G. In the present embodiment, in order to minimize a stress remaining at the bonding part of the bonding wire 25, each of a distance H1 between the end edge 15a of the conductor portion 15 and the n-side electrode 22 of the semiconductor light-emitting element 5 and a distance H2 between the end edge 15a of the conductor portion 15 and the p-side electrode 23 is set at, e.g. 0.25 mm to 6.0 mm.

As shown in FIG. 1, the reflector 6 is formed, for example, in a rectangular frame shape and surrounds all semiconductor light-emitting elements 5 on the base board 2 as a group. In other words, the reflector 6 is not associated with the individual semiconductor light-emitting elements 5, but is configured as a structural element which is common to all semiconductor light-emitting elements 5.

The reflector 6 is attached to the insulator 3. In the present embodiment, all the conductor portions 15 of the conductor 4 are located within the region surrounded by the reflector 6. The first and second terminal portions 16a and 16b of the conductor 4 are located outside the reflector 6.

The reflector 6 is formed of, e.g. a synthetic resin, and its inner peripheral surface is formed as a light reflective surface 6a. In this embodiment, in order to obtain the light reflective surface 6a, white powder is mixed in the resin material, of which the reflector 6 is to be formed, and thereby the light-reflective surface 6a itself is formed in a white color with high reflectance of visible light. The reflector 6 is usable, for example, as an attachment part of a lens for controlling distribution of light.

As shown in FIG. 2, the sealing member 7 is filled in the region surrounded by the reflector 6. The sealing member 7 is solidified, for example, by heating treatment, and covers the semiconductor light-emitting elements 5, insulator 3 and bonding wires 25 and 26 which are located inside the reflector 6. Further, the sealing member 7 is continuously filled in the gap g between the through hole 11 of the insulator 3 and the outer peripheral surface 8c of the projection portion 8. The sealing member 7 thus covers the excess portion 12a of the adhesive, which protrudes into the through hole 11 and the outer peripheral surface 8c of the projection 8.

The sealing member 7 is formed of a light-transmissive material such as a transparent silicone resin. A phosphor is mixed, where necessary, in the sealing member 7. In the present embodiment, use is made of the phosphor which wavelength-convert blue primary light that is emitted from the blue LED chip to yellow secondary light having a different wavelength. The phosphor is mixed, as a preferable example, in the sealing member 7 in a substantially uniformly dispersed state.

The phosphor, which is excited by blue light emitted from the semiconductor light-emitting layer 21, absorb the blue light and emit yellow light. The yellow light travels through the sealing member 7. On the other hand, part of the blue light emitted from the semiconductor light-emitting layer 21 passes through the sealing member 7 without striking the phosphor. By the mixing of the two complementary colors, white light can be obtained.

In addition, since the reflector 6 is formed in such a frame shape as to surround all semiconductor light-emitting elements 5 as a group, most of the light, which is extracted to the outside of the illumination device 1 through the sealing member 7, travels through the sealing member 7 without being reflected by the light reflective surface 6a of the reflector 6. Therefore, the loss of light due to reflection decreases, and the light emitted from the semiconductor light-emitting elements 5 can efficiently be taken out of the illumination device 1.

In the illumination device 1 of the first embodiment, the excess portion 12a of the adhesive, which forms the adhesive layer 12, protrudes into the through hole 11 of the insulator 3. Thus, the adhesive layer 12 is entirely filled between the base board 2 and the insulator 3. Therefore, no gap, which is continuous with the through hole 11, is formed between the base board 2 and the insulator 3.

In the case where a gap, which is continuous with the through hole 11, is present between the base board 2 and the insulator 3, the air remaining in the gap becomes bubbles when the sealing member 7 is heated, and the bubbles flow into the sealing member 7. The air stays in the sealing member 7 as bubbles. If moisture from the outside enters the bubbles staying in the sealing member 7, it is undeniable that the dielectric strength of the sealing member 7 lowers. According to the first embodiment, however, no gap, which leads to occurrence of bubbles, is formed between the base board 2 and the insulator 3. Therefore, the decrease in the dielectric strength of the sealing member 7 can be prevented.

According to the first embodiment, the plural semiconductor light-emitting elements 5 disposed on the base board 2 are caused to emit light, and the light is extracted to the side opposite to the base board 2, as shown by an arrow in FIG. 2, thus effecting illumination. Thereby, the illumination device 1 which is capable of performing area light emission can be obtained.

In the first embodiment, the insulator 3, which effects electrical insulation between the conductor portion 15 of the conductor 4 and the base board 2, is excluded from between the semiconductor light-emitting element 5 and the distal end face 8a of the projection portion 8, and the substrate 20 of the semiconductor light-emitting element 5 is bonded to the light reflective layer 10 of the projection portion 8.

Thus, the heat produced by the semiconductor light-emitting element 5 is directly conducted to the base board 2, without interference by the insulator 3. To be more specific, the heat of the semiconductor light-emitting element 5 is conducted to the projection portion 8 of the base board 2 via the light reflective layer 10 of the silver thin film from the bonding material 24 that is so thin that its thermal resistance is substantially ignorable. Furthermore, since the projection portion 8 is so formed as to have a gradually increasing thickness from the distal end face 8a toward the proximal portion 8b and the cross-sectional area of the projection portion 8 gradually increases toward the front surface 2a of the base board 2, the heat of the semiconductor light-emitting element 5 can efficiently be conducted from the distal end face 8a of the projection portion 8 to the base board 2. The heat that is conducted to the base board 2 is radiated from the back surface 2b of the base board 2 to the outside of the base board 2.

Therefore, the temperature rise of the semiconductor light-emitting element 5 can surely be prevented, and the operation temperature of the semiconductor light-emitting element 5 can be kept at proper values. As a result, the decrease in light emission efficiency of the semiconductor light-emitting element 5 can be suppressed, and the variance in light emission amount of the semiconductor light-emitting element 5 can be eliminated. Therefore, the non-uniformity in color of light emitted from the respective semiconductor light-emitting elements 5 can be suppressed.

The direction of light emission is not restricted in the semiconductor light-emitting element 5. In particular, the intensity of light emitted toward the base board 2 is higher than the intensity of light emitted in the light-extraction direction opposite to the base board 2. Most of the light emitted toward the base board 2 is incident on the light reflective layer 10 having a reflectance of 90% or more through the bonding material 24, and the light is then reflected by this light reflective layer 10 in the light-extraction direction. In this manner, the light, which is emitted from the semiconductor light-emitting element 5 toward the base board 2, is efficiently reflected just under the semiconductor light-emitting element 5. Therefore, the light can efficiently be extracted.

Figure 4:
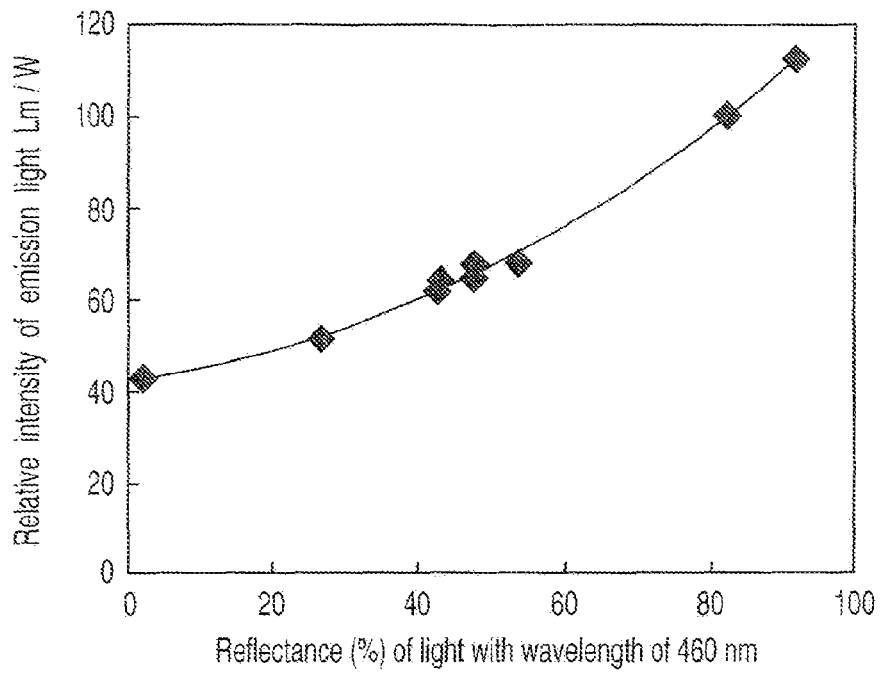
FIG. 4 is a characteristic graph showing the relationship between a reflectance immediately under the semiconductor light-emitting element and a luminous flux in the first embodiment of the invention.

FIG. 4 shows the relationship between the reflectance immediately under the semiconductor light-emitting element 5 and a luminous flux. As is clearly understood from FIG. 4, as regards light with a wavelength of 460 nm, the intensity of extracted light (relative intensity of emission light) becomes higher as the reflectance is higher. It was confirmed that the reflectance immediately under the semiconductor light-emitting element 5 reaches 91.35%.

Moreover, part of the light emitted from the semiconductor light-emitting element 5 toward the base board 2 and part of the light emitted from the phosphor within the sealing member 7 are incident on the white insulator 3 and are reflected by the white insulator 3 in the light-extraction direction. In addition, the part of the light emitted toward the base board 2 is incident on the light reflective layer 18 covering the conductor portion 15, and is reflected by the light reflective layer 18 in the light-extraction direction. Besides, the portion 3a of the insulator 3 is not covered with the conductor portion 15 and is exposed to the periphery of the through hole 11. In other words, the portion 3a of the insulator 3 can be regarded as a white reflection surface which is continuous in the circumferential direction of the through hole 11. Thus, the light, which is incident on the portion 3a of the insulator 3, can be reflected in the light-extraction direction.

Figure 5:
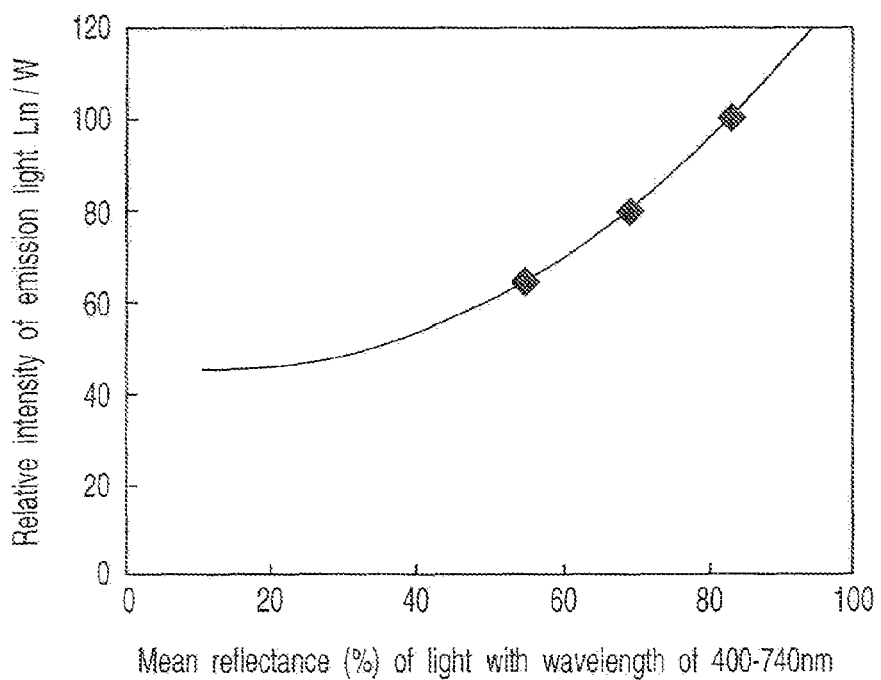
FIG. 5 is a characteristic graph showing the relationship between a reflectance at the periphery of the semiconductor light-emitting element and a luminous flux in the first embodiment of the invention.

FIG. 5 shows the relationship between a mean reflectance at the periphery of the semiconductor light-emitting element 5 and a luminous flux. As is clearly understood from FIG. 5, the intensity of extracted light (relative intensity of emission light) becomes higher as the mean reflectance of light with a wavelength of 400 nm to 740 nm is higher. It was confirmed that the mean reflectance at the periphery of the semiconductor light-emitting element 5 reaches 93.7%.

As is clear from FIG. 4 and FIG. 5, the emission light intensity decreases as the reflectance becomes lower, and the emission light intensity increases as the reflectance becomes higher. Thus, the light emission efficiency (light extraction efficiency) of the illumination device 1 can be enhanced by the high-efficiency reflection characteristics of the light reflective layers 10 and 18 and the insulator 3. According to experiments by the inventor of the present invention, it was confirmed that illumination can be effected with a luminous flux of 7.41 lm and a light emission efficiency of 125 lm/W in the case where the power consumption of the illumination device 1 is 0.06 W.

Therefore, according to the illumination device 1 of the first embodiment, while the decrease in light emission efficiency due to the temperature rise of the semiconductor light-emitting element 5 is suppressed, the light that is emitted from the semiconductor light-emitting element 5 toward the base board 2 is reflected and light can efficiently be extracted.

Furthermore, according to the first embodiment, the annular gap g is present between the outer peripheral surface 8c of the projection portion 8 and the through hole 11 of the insulator 3, and a part of the sealing member 7 is filled in the gap g. Thus, part of the light emitted from the phosphor in the sealing member 7 is made incident on the outer peripheral surface 8c of the projection portion 8 without being blocked by the insulator 3. The outer peripheral surface 8c of the projection portion 8 is inclined so as to flare from the distal end face 8a of the projection portion 8 toward the proximal portion 8b. Thereby, the light incident on the outer peripheral surface 8c can positively be reflected in the light-extraction direction opposite to the base board 2. Therefore, the light emitted from the semiconductor light-emitting element 5 can efficiently be extracted by making use of the projection portion 8 that promotes heat radiation of the semiconductor light-emitting element 5.

Moreover, the bonding material 24, which bonds the semiconductor light-emitting element 5 to the distal end face 8a of the projection portion 8, is the transparent silicone resin. There is very little possibility that the degradation of the silicone resin, including a change in color due to heat, progresses. As a result, the extraction of light reflected by the light reflective layer 10 can be maintained in good condition for a long time, without the light incident on the light reflective layer 10 being blocked by the bonding material 24, or without the extraction of the light reflected by the light reflective layer 10 being hindered by the bonding material 24.

In the first embodiment, one semiconductor light-emitting element 5 is disposed on the distal end face 8a of one projection portion B. The present invention, however, is not limited to this configuration. For example, a plurality of semiconductor light-emitting elements 5 may be disposed on the distal end face 8a of one projection portion 8. In this case, a plurality of semiconductor light-emitting elements 5, which emit light of the same color, or a plurality of semiconductor light-emitting elements 5, which emit lights of different colors, may be employed. In the case where the semiconductor light-emitting elements 5 which emit lights of different colors are employed, three semiconductor light-emitting elements 5 which emit lights of red, yellow and blue, for instance, may be arrayed in line. By arraying the plural semiconductor light-emitting elements 5 on the distal end face 8a of one projection portion 8, the entire luminous flux of the illumination device 1 can be more improved.

FIG. 6 shows a second embodiment of the present invention. The second embodiment differs from the first embodiment with respect to the structure of the reflector 6. In the other structural aspects, the second embodiment is the same as the first embodiment. Thus, in the second embodiment, the structural parts common to those in the first embodiment are denoted by like reference numerals, and a description thereof is omitted.

As shown in FIG. 6, the reflector has a plurality of reflection holes 31 (only one of them being shown) which are associated with the semiconductor light-emitting elements 5. The semiconductor light-emitting element 5, which is bonded to the projection portion 8 of the base board 2, is individually disposed in the reflection hole 31. The reflection hole 31 is a taper hole with a diameter which gradually increases from the base board 2 in the light-extraction direction. The sealing member 7 is filled in each of the reflection holes 31. The sealing member 7 is continuously filled in the gap g between the through hole 11 of the insulator 3 and the outer peripheral surface 8c of the projection portion 8, and the sealing member 7 covers the excess portion 12a of the adhesive, which protrudes into the through hole 11 and the outer peripheral surface 8c of the projection portion 8.

In this second embodiment, too, the heat of the semiconductor light-emitting element 5 is let to escape directly to the base board 2, and the light traveling from the semiconductor light-emitting element 5 toward the base board 2 is reflected, and thereby the light can efficiently be extracted.

Moreover, in the second embodiment, since the sealing member 7 is filled in each reflection hole 31, the amount of the sealing member 7 that is used can be made less than in the first embodiment. Besides, the reflector 6 can be used, for example, as an attachment part of a lens for controlling distribution of the light that is passed through the sealing member 7 and is extracted.

Figure 7:
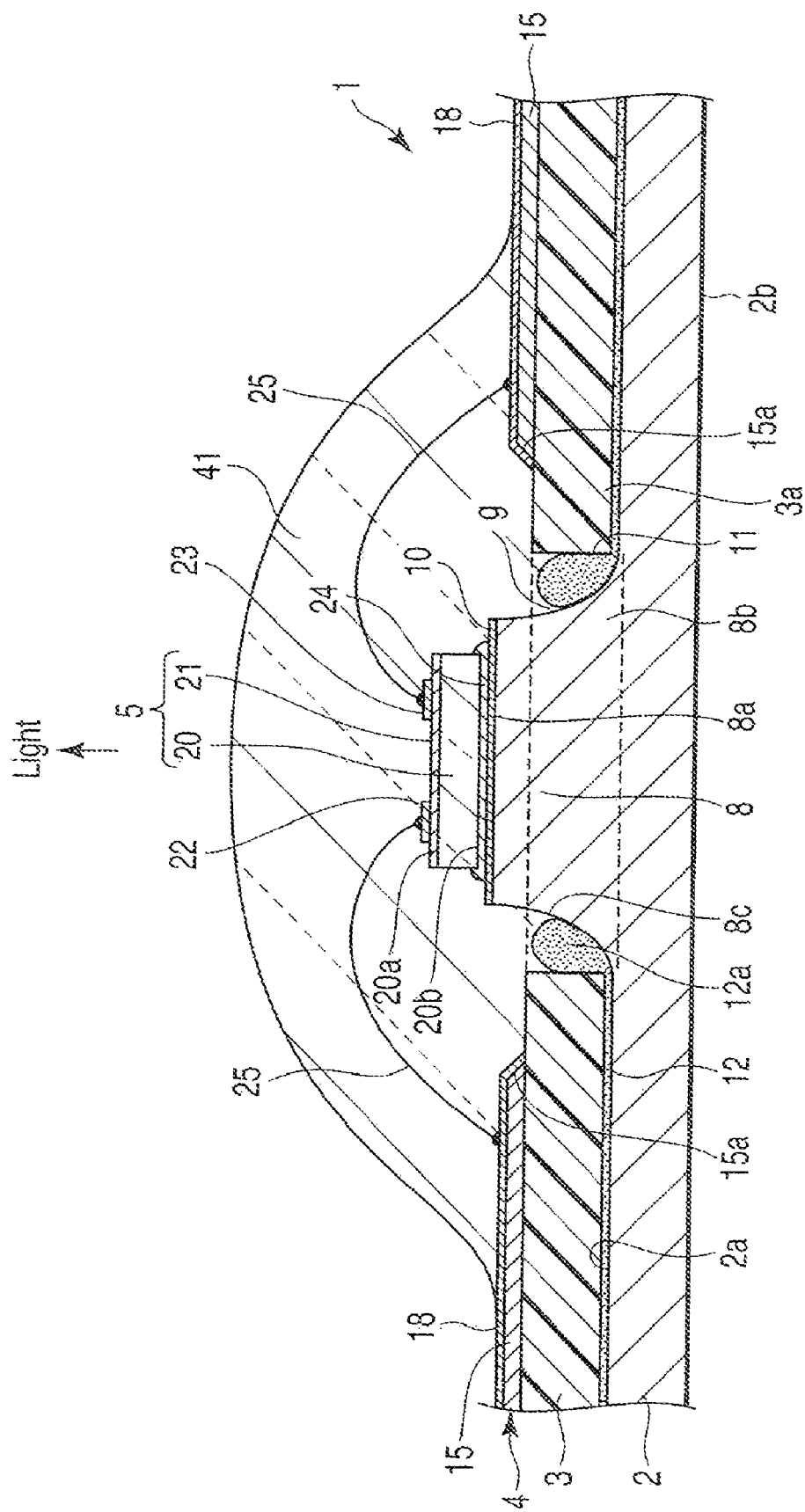
FIG. 7 is a cross-sectional view of an illumination device according to a third embodiment of the invention.

FIG. 7 shows a third embodiment of the present invention.

The third embodiment differs from the first embodiment in that the reflector of the illumination device 1 is dispensed with. In the other respects, the structure of the illumination device 1 of the third embodiment is the same as in the first embodiment.

In the third embodiment, the semiconductor light-emitting element 5, which is bonded to the projection portion 8 of the base board 2, is individually sealed by a sealing member 41. The sealing member 41 is formed by dispensing a non-solidified resin on each of the semiconductor light-emitting element 5 from a dispenser (not shown). The non-solidified resin, after dispensed from the dispenser, is solidified in a hemispherical shape. The sealing member 41 includes a phosphor. The phosphor is uniformly dispersed in the sealing member 41. Further, the sealing member 41 is continuously filled in the gap g between the through hole 11 of the insulator 3 and the outer peripheral surface 8c of the projection portion 8, and covers the excess portion 12a of the adhesive, which protrudes into the through hole 11 and the outer peripheral surface 8c of the projection portion 8.

In the third embodiment, too, the heat of the semiconductor light-emitting element 5 is let to escape directly to the base board 2, and the light traveling from the semiconductor light-emitting element 5 toward the base board 2 is reflected, and thereby the light can efficiently be extracted.

Moreover, according to the third embodiment, since the plural semiconductor light-emitting elements 5 may individually be sealed by the sealing member 41, the amount of the sealing member 41 that is used can be made less than in the first embodiment.

FIG. 8 to FIG. 11 show a fourth embodiment of the present invention.

The structure of the fourth embodiment is the same as that of the first embodiment, except for the respects described below. Thus, in the fourth embodiment, the structural parts common to those in the first embodiment are denoted by like reference numerals, and a description thereof is omitted.

Figure 8:
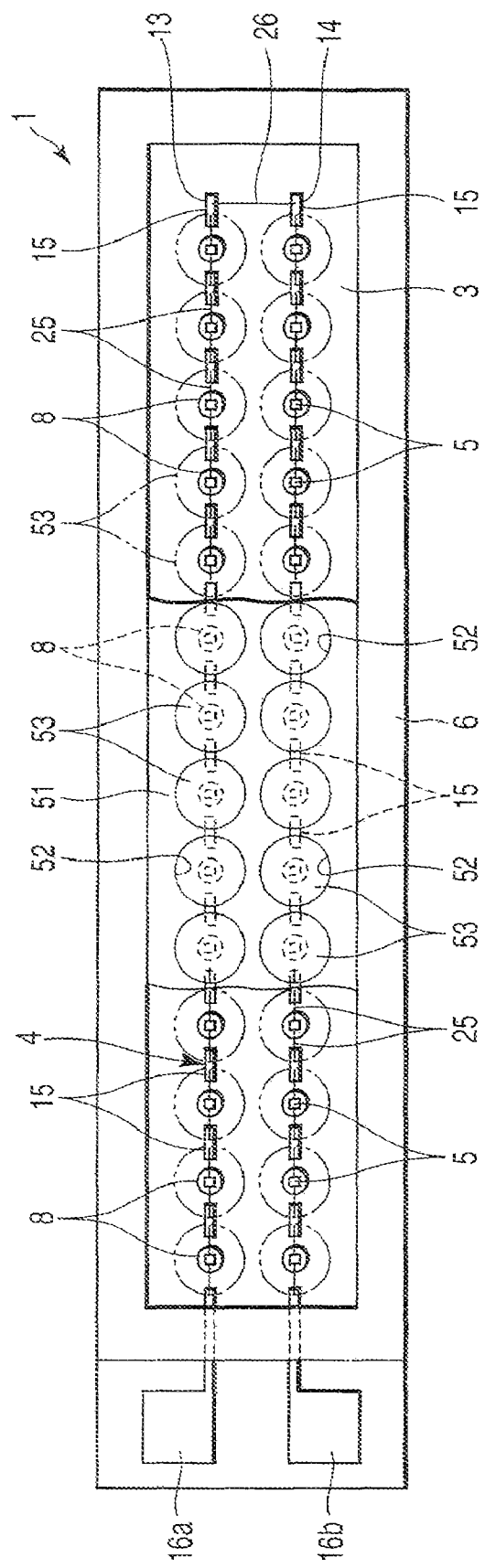
FIG. 8 is a plan view of an illumination device according to a fourth embodiment of the invention.
Figure 10:
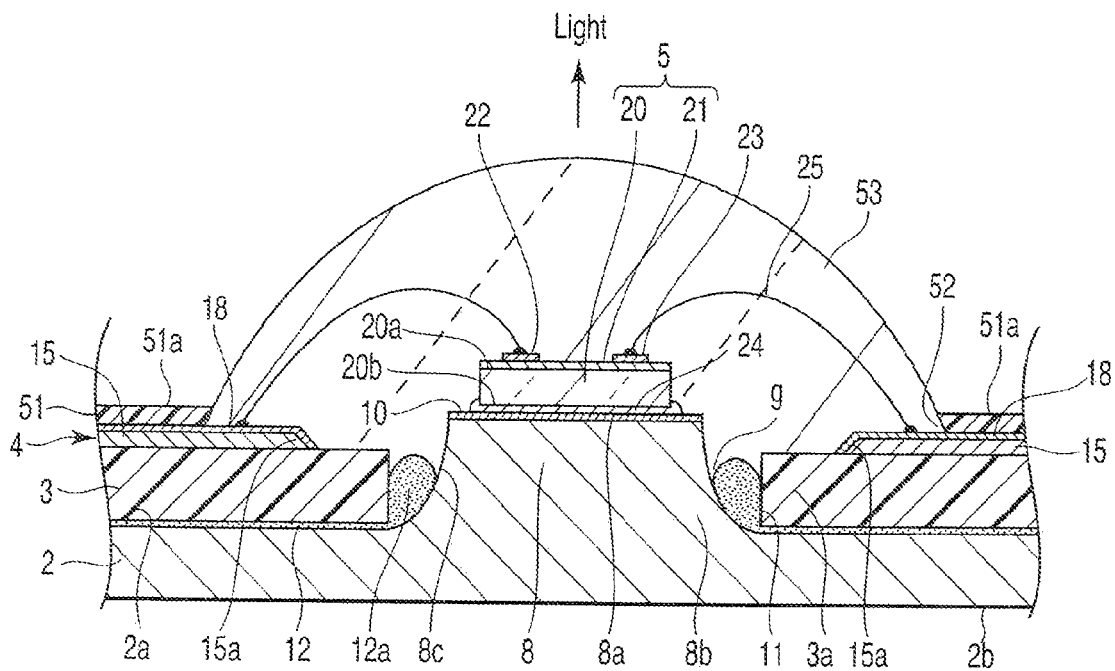
FIG. 10 is a cross-sectional view taken along line F10-F10 in FIG. 9.

As shown in FIG. 8 and FIG. 10, a resist layer 51 is stacked on the conductor portions 15 which are covered with the light reflective layer 18, and the insulator 3. The resist layer 51 prevents at least oxidation of both oxidation and sulfuration of the conductor portion 15. The resist layer 51 is formed of a synthetic resin in which white powder, such as aluminum oxide powder, is mixed, and has electrical insulation properties. The light reflectance of the resist layer 51 is 80% or more. The thickness of the resist layer 51 is, e.g. about 0.1 mm.

The resist layer 51 includes a plurality of openings 52 which correspond to the projection portions 8. The resist layer 51 includes a first stack portion 51a which covers the conductor portions 15, and a second stack portion 51b which covers the insulator 3. The first stack portion 51a and second stack portion 51b are integrally continuous with each other. As is clear from the comparison between FIG. 10 and FIG. 11, the height of the first stack portion 51a relative to the insulator 3 and the height of the second stack portion 51b relative to the insulator 3 are different by a degree corresponding to the thickness of the conductor portion 15 including the light reflective layer 18.

Figure 9:
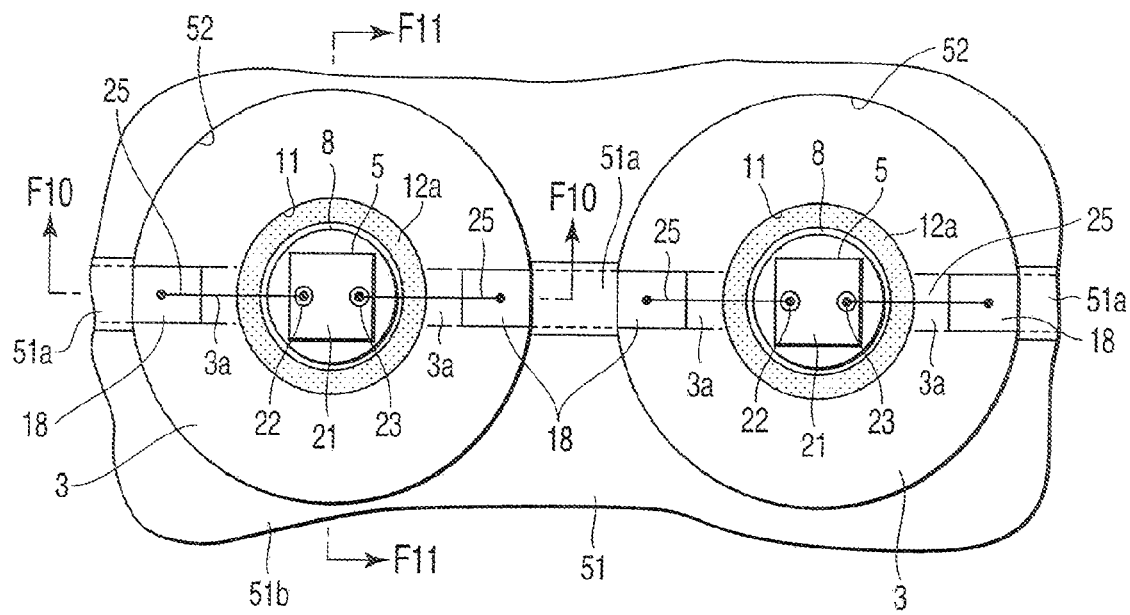
FIG. 9 is a plan view showing a positional relationship between a semiconductor light-emitting element which is bonded to a distal end face of a projection portion, an insulator, a conductor and a resist layer in the fourth embodiment of the invention.

As shown in FIG. 9, the opening 52 is circular and the diameter of the opening 52 is several times greater than the diameter of the projection portion 8. When the resist layer 51 is viewed in plan, one projection portion 8 is coaxially located inside each opening 52. In addition, the semiconductor light-emitting element 5, which is bonded to the light reflective layer 10 of the projection portion 8, and the two bonding wires 25, which are connected to the semiconductor light-emitting element 5, are located inside each opening 52. Furthermore, the connection parts between the two conductor portions 15, which are so disposed as to sandwich the semiconductor light-emitting element 5, and the bonding wires 25 are located inside each opening 52. Thus, the resist layer 51 covers the insulator 3 in such a manner as to exclude the through hole 11 through which the projection portion 8 penetrates, and the end portions of the conductor portions 15 neighboring the projection portion 8.

Figure 11:
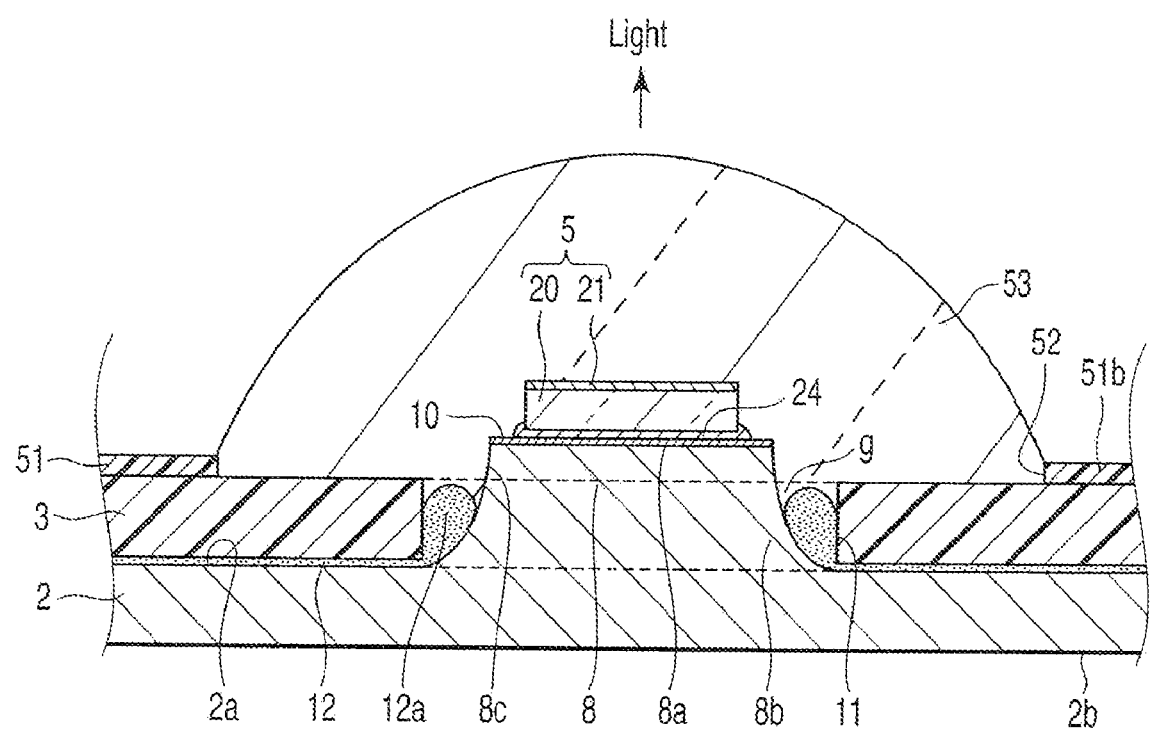
FIG. 11 is a cross-sectional view taken along line F11-F11 in FIG. 9.

As shown in FIG. 10 and FIG. 11, the openings 52 of the resist layer 51 are individually sealed by the sealing member 53. The sealing member 53 is formed by dispensing a non-solidified resin in each opening 52 from the dispenser (not shown). The non-solidified resin, after dispensed from the dispenser, is solidified in a hemispherical shape. The sealing member 53 includes a phosphor. The phosphor is uniformly dispersed in the sealing member 53.

The sealing member 53 continuously covers the semiconductor light-emitting element 5 located within each opening 52, the two bonding wires 25 and the end portions of the conductor portions 15, to which the bonding wires 25 are connected. Moreover, the sealing member 7 is continuously filled in the gap g between the through hole 11 of the insulator 3 and the outer peripheral surface 8c of the projection portion 8. The sealing member 7 thus covers the excess portion 12a of the adhesive, which protrudes into the through hole 11 and the outer peripheral surface 8c of the projection 8.

In this fourth embodiment, too, the heat of the semiconductor light-emitting element 5 is let to escape directly to the base board 2, and the light traveling from the semiconductor light-emitting element 5 toward the base board 2 is reflected, and thereby the light can efficiently be extracted.

Since the resist layer 51, which covers the conductor portion 15 and insulator 3, is white, the light emitted from the semiconductor light-emitting element 5 can be reflected by the resist layer 51 in the light-extraction direction opposite to the base board 2. Therefore, the light emitted from the semiconductor light-emitting element 5 can efficiently be extracted.

Besides, since the sealing member 53 individually covers the openings 52 of the resist layer 51, the amount of use of the sealing member 53 in which the phosphor is mixed can be made less than in the first embodiment.

Moreover, since the sealing member 53 is obtained by dispensing the non-solidified resin in the opening 52, the flow of the non-solidified resin can be stemmed by the opening edge of the opening 52 until the non-solidified resin is solidified. Thus, the non-solidified resin can be prevented from spreading over the surface of the resist layer 51, and the height of rising of the sealing member 53 can properly be determined. Therefore, a sufficient thickness of that part of the sealing member 53, which covers the semiconductor light-emitting element 5, can be secured, and the semiconductor light-emitting element 5 and the bonding wires 25 can surely be sealed by the sealing member 53.

Figure 12:
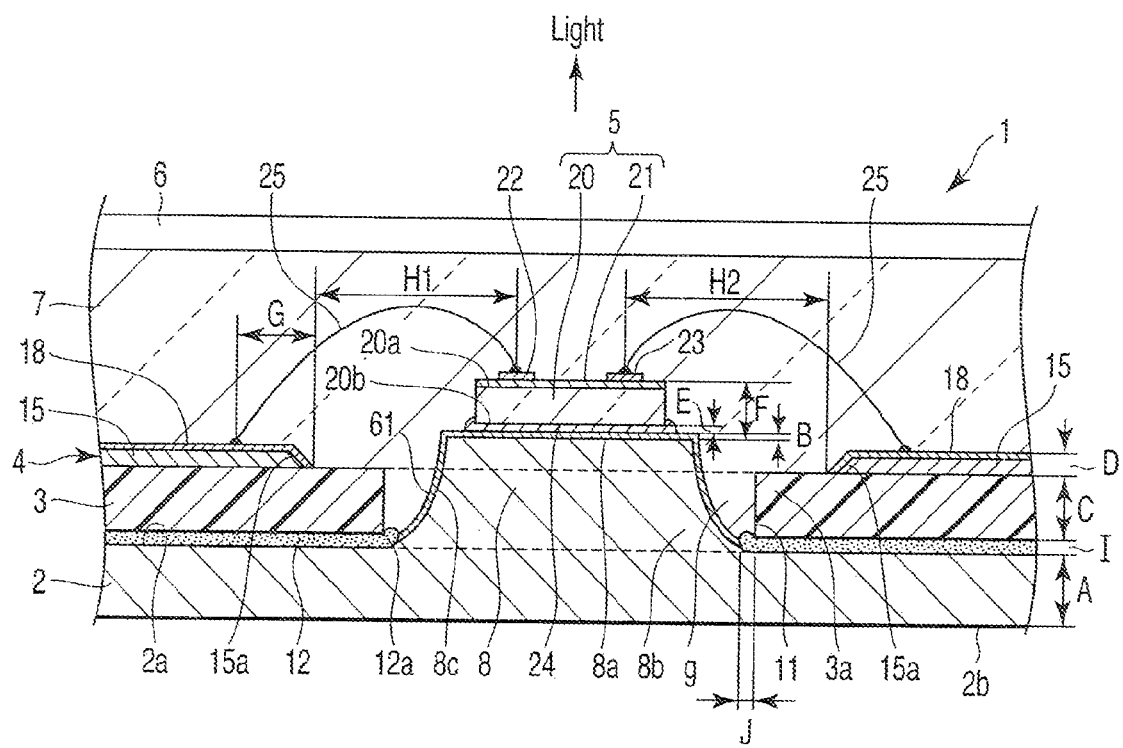
FIG. 12 is a cross-sectional view of an illumination device according to a fifth embodiment of the invention.
Figure 13:
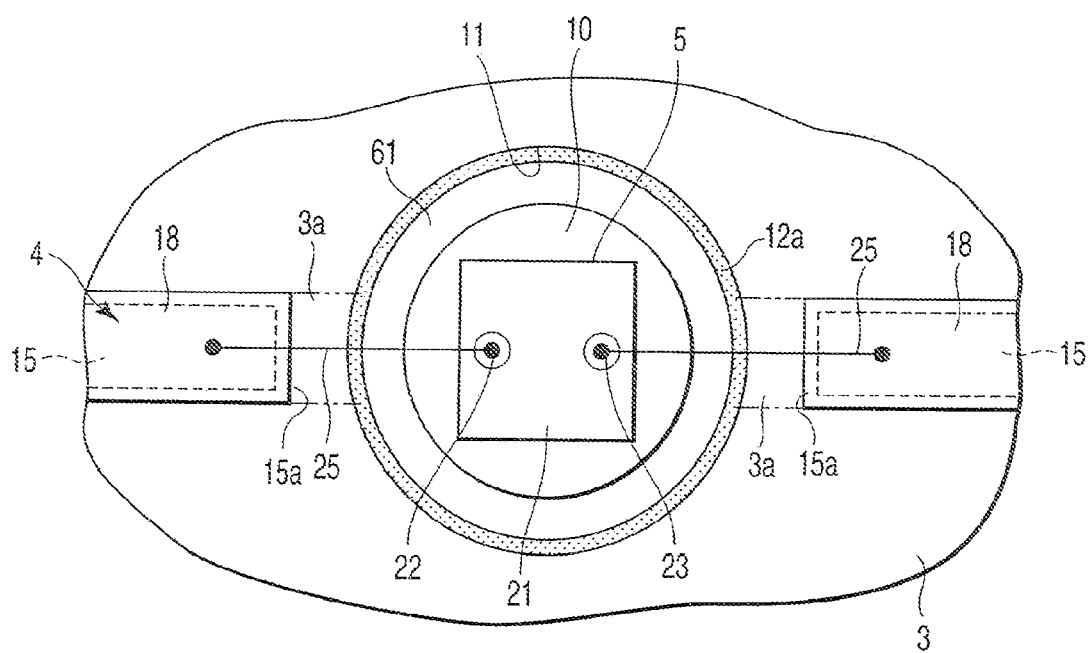
FIG. 13 is a plan view showing a positional relationship between a semiconductor light-emitting element which is bonded to a distal end face of a projection portion, an insulator, a conductor and a light reflective layer in the fifth embodiment of the invention.

FIG. 12 and FIG. 13 show a fifth embodiment of the present invention.

The structure of the fifth embodiment is the same as that of the first embodiment, except for the respects described below. Thus, in the fifth embodiment, the structural parts common to those in the first embodiment are denoted by like reference numerals, and a description thereof is omitted.

In the fifth embodiment, a resin adhesive sheet is used as the adhesive layer 12. The color of the adhesive layer 12, which is formed by using the resin adhesive sheet, is brown, and the light reflectance of the adhesive layer 12 is lower than that of the white insulator 3. The adhesive layer 12 has a plurality of holes corresponding to the projection portions 8 of the base board 2. The diameter of each hole is greater than the diameter of the proximal portion 8b of the projection portion 8. The thickness I of the adhesive layer 12 is several times greater than the thickness of the adhesive layer 12 in the first embodiment.

The adhesive layer 12 is laid over the front surface 2a of the base board 2 in the state in which the projection portion 8 is passed through the associated hole. After the adhesive layer 12 is laid over the base board 2, the insulator 3 is laid over the adhesive layer 12. The mutually stacked base board 2, adhesive layer 12 and insulator 3 are pressed in the direction of stacking, and thereby the base board 2 and the insulator 3 are bonded by the adhesive layer 12. As shown in FIG. 12, since the adhesive layer 12 is pressed between the base board 2 and the insulator 3, the opening edge of the hole of the adhesive layer 12 protrudes into the through hole 11. Specifically, the excess portion 12a of the adhesive layer 12 is protruded into the annular gap g between the outer peripheral surface 8c of the projection portion 8 and the through hole 11. The excess portion 12a is solidified in the state in which the excess portion 12a is continuous in the circumferential direction of the through hole 11. The dimension J of protrusion of the excess portion 12a is, e.g. 0.2 mm or less. The dimension J of protrusion can be adjusted by adjusting the thickness of the adhesive layer 12 and the pressing force on the adhesive layer 12. Moreover, the excess portion 12a of the adhesive layer 12 covers the front surface 2a of the base board 2 and rises in the through hole 11.

In the fifth embodiment, a side light reflective layer 61 is stacked on the outer peripheral surface 8c of each projection portion 8. The side light reflective layer 61 is continuous with the light reflective layer 10 stacked on the distal end face 8a of the projection portion 8 and with the excess portion 12a of the adhesive layer 12. The side light reflective layer 61 is a silver thin film which is similar to the light reflective layer 10, and is formed together with the light reflective layer 10 by electroless plating on the projection portion 8. Since the electroless plating is performed before the insulator 3 is attached to the base board 2, the side light reflective layer 61 is not formed on the excess portion 12a of the adhesive layer 12. Thus, the side light reflective layer 61 does not reach that part of the base board 2, which is covered with the excess portion 12a of the adhesive layer 12.

Further, the sealing member 7 is continuously filled in the gap g between the through hole 11 of the insulator 3 and the outer peripheral surface 8c of the projection portion 8, and the sealing member 7 thus covers the excess portion 12a of the adhesive layer 12, which protrudes into the through hole 11 and the outer peripheral surface 8c of the projection 8.

In the fifth embodiment, too, the heat of the semiconductor light-emitting element 5 is let to escape directly to the base board 2, and the light traveling from the semiconductor light-emitting element 5 toward the base board 2 is reflected, and thereby the light can efficiently be extracted.

Moreover, in the fifth embodiment, the outer peripheral surface 8c of the projection portion 8 is covered with the side light reflective layer 61, and the side light reflective layer 61 is continuous with the light reflective layer 10 that covers the distal end face 8a of the projection portion 8. Thus, part of the light emitted from the phosphor in the sealing member 7 is incident not only on the light reflective surface 10 at the distal end of the projection portion 8, but also on the side light reflective layer 61 via the gap g. Accordingly, the side light reflective layer 61 reflects the light, which travels toward the outer peripheral surface 8c of the projection 8, in the light-extraction direction opposite to the base board 2. Thereby, the light can efficiently be extracted.

According to experiments conducted by the inventor, the entire luminous flux of the illumination device 1, in which the distal end face 8a and outer peripheral surface 8c of the projection 8 are covered with the light reflective layers 10 and 18, was 110, in the case where the entire luminous flux of the illumination device, in which no light reflective layer is provided on the projection portion 8, was set at 100. Therefore, according to the illumination device 1 of the fifth embodiment, the light extraction efficiency can be increased by 10%.

In the fifth embodiment, the excess portion 12a of the adhesive layer 12 rises from the base board 2 between the outer peripheral surface 8c of the projection section 8 and the through hole 11. It is hence undeniable that the area of the side light reflective layer 61 is decreased by the excess portion 12a. However, since the dimension J of protrusion of the excess portion 12a is 0.2 mm or less and is very small, the decrease in area of the side light reflective layer 61 is practically ignorable. In addition, even if the color of the adhesive layer 12 is, for example, brown or black, other than white, the light absorbing function of the excess portion 12a of the adhesive layer 12 is also substantially ignorable.

In the fifth embodiment, the height of the excess portion 12a of the adhesive layer 12, which protrudes into the through hole 11, can be made substantially equal to the height of the surface of the insulator 3. Even in the case where the height of the excess portion 12a of the adhesive layer 12 is increased, the distal end face 8a of the projection portion 8, which is covered with the light reflective layer 10, projects higher than the surface of the insulator 3. Thus, all the side light reflective layer 61 is not covered with the excess portion 12a. Therefore, even if the adhesive layer 12 is colored, the light traveling toward the projection portion 8 can be reflected by the side light reflective layer 61, and the light can efficiently be extracted.

Furthermore, if the height of the excess portion 12a of the adhesive layer 12 is increased and made substantially equal to the height of the surface of the insulator 3, most of the gap g is filled with the excess portion 12a. Thus, when a non-solidified resin is filled in the region surrounded by the reflector 6, air hardly remains in the through hole 11. Therefore, by virtue of the presence of the adhesive layer 12, no gap occurs between the base board 2 and the insulator 3, and bubbles are prevented from remaining in the sealing member 7.

According to the fifth embodiment, since the adhesive layer 12 is brown, there is a sharp contrast between the excess portion 12a of the adhesive layer 12, which protrudes into the through hole 11, and the white insulator 3. Thereby, the position of the through hole 11 of the insulator 3 can easily be recognized. Accordingly, the semiconductor light-emitting element 5 can be bonded to the projection portion 8 by using the position of the through hole 11 as a reference position.

Specifically, in the case where the semiconductor light-emitting element 5 is bonded to the projection portion 8 that penetrates the through hole 11, a region of the through hole 11 is first imaged by a CCD camera that is provided in a mounting device for bonding the semiconductor light-emitting element 5 to the projection portion 8. Subsequently, the image captured by an image recognition unit of the mounting device is recognized, and the recognized image is collated with a reference image that is prestored in the image recognition unit. Thereby, when the semiconductor light-emitting element 5 is to be bonded to the projection portion 8, a reference position for determining the position of the semiconductor light-emitting element 5, relative to the projection portion 8, is set. The mounting device bonds the semiconductor light-emitting element 5 to a position based on the reference position that is set.

In the fifth embodiment, the color of the excess portion 12a of the adhesive layer 12 is brown, and the light reflectance of the excess portion 12a is lower than that of the white insulator 3. Thus, the image recognition unit can easily recognize the through hole 11 that is located at the boundary between the insulator 3 and the excess portion 12a of the adhesive layer 12. As a result, when the semiconductor light-emitting element 5 is to be bonded to the projection portion 8 that penetrates the through hole 11, the reference for determining the position of the semiconductor light-emitting element 5, relative to the projection portion 8, can surely be acquired.

In the fifth embodiment, it is not necessary that the adhesive layer 12 be colored in brown. The adhesive layer 12 may be transparent. In the case where the excess portion 12a of the adhesive layer 12 is transparent, the color of the image of the base board 2, which is captured through the excess portion 12a, becomes the color of the material of the base board 2. For example, if the base board 2 is formed of copper, the color of the base board 2 is brown. If the base board 2 is formed of a carbon-based material, the color of the base board 2 is black. The brown or black base board 2 has a lower reflectance than the white insulator 3.

As a result, the color of the base board 2, which is recognized through the excess portion 12a of the adhesive layer 12, is different from the color of the peripheral portion of the through hole 11 of the insulator 3, and the through hole 11, which is located at the boundary between the insulator 3 and the excess portion 12a of the adhesive layer 12, can easily be recognized. Hence, when the semiconductor light-emitting element 5 is to be bonded to the projection portion 8 that penetrates the through hole 11, the reference for determining the position of the semiconductor light-emitting element 5, relative to the projection portion 8, can surely be acquired.

Figure 14:
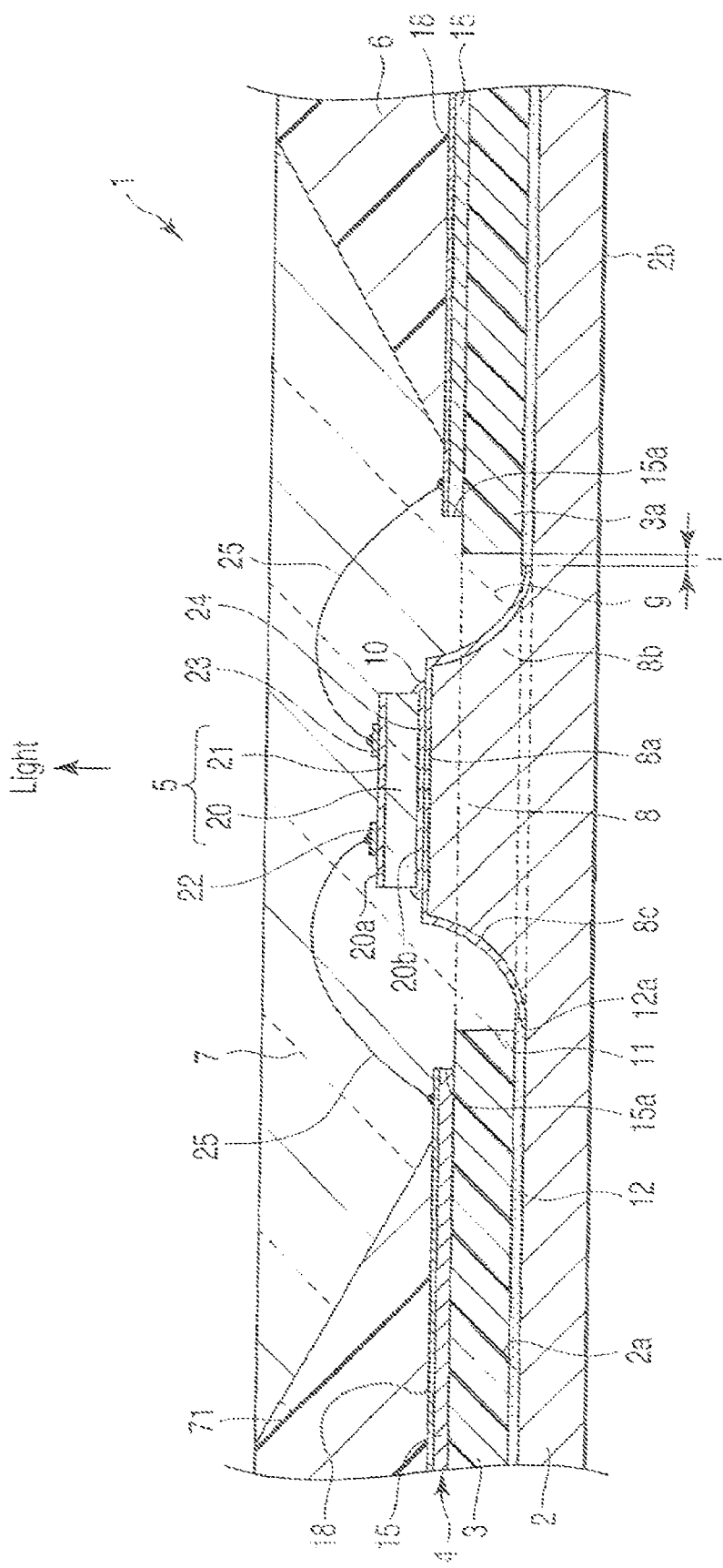
FIG. 14 is a cross-sectional view of an illumination device according to a sixth embodiment of the invention.

FIG. 14 shows a sixth embodiment of the present invention.

The sixth embodiment differs from the fifth embodiment with respect to the structure of the reflector 6. In the other respects, the structure of the illumination device 1 of the sixth embodiment is the same as that of the illumination device 1 of the fifth embodiment. Thus, in the sixth embodiment, the structural parts common to those in the fifth embodiment are denoted by like reference numerals, and a description thereof is omitted.

As shown in FIG. 14, the reflector 6 has a plurality of reflection holes 71 (only one of them being shown) which are associated with the semiconductor light-emitting elements 5. The semiconductor light-emitting element 5, which is bonded to the light reflective layer 10 of the projection portion 8, is individually disposed in the reflection hole 71. The reflection hole 71 is a taper hole with a diameter which gradually increases from the base board 2 in the light-extraction direction. The sealing member 7 is filled in each of the reflection holes 71. The sealing member 7 is continuously filled in the gap g between the through hole 11 of the insulator 3 and the outer peripheral surface 8c of the projection portion 8, and the sealing member 7 covers the excess portion 12a of the adhesive layer 12, which protrudes into the through hole 11 and the outer peripheral surface 8c of the projection portion 8.

In this sixth embodiment, too, the heat of the semiconductor light-emitting element 5 is let to escape directly to the base board 2. In addition, the light traveling from the semiconductor light-emitting element 5 toward the base board 2 is reflected by the light reflective layer 10 and the side light reflective layer 61 of the projection portion 8, and thereby the light can efficiently be extracted.

Moreover, since the sealing member 7 is filled in each reflection hole 71, the amount of the sealing member 7 that is used can be made less than in the fifth embodiment.

Figure 15:
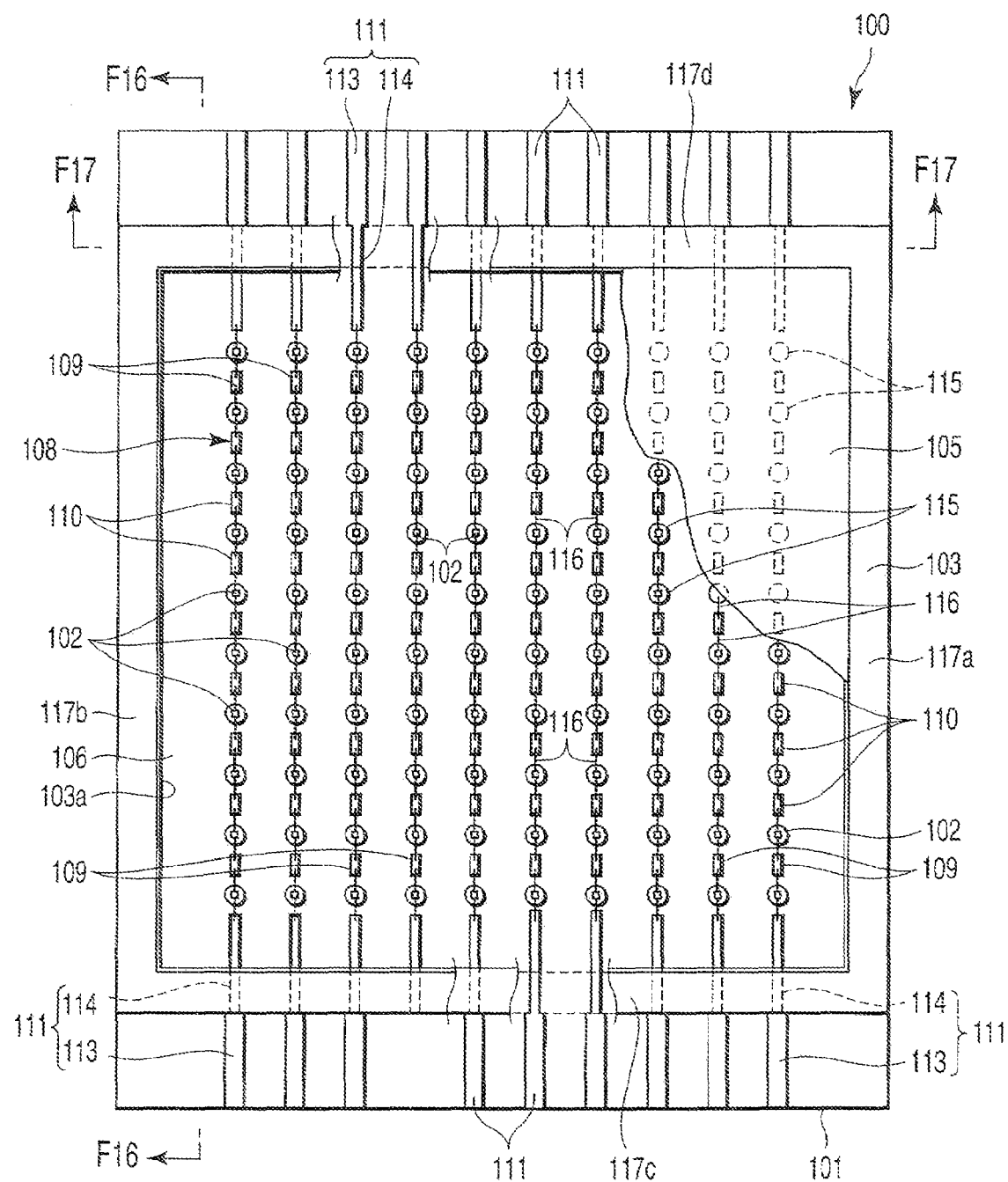
FIG. 15 is a plan view of an illumination device according to a seventh embodiment of the invention.
Figure 16:
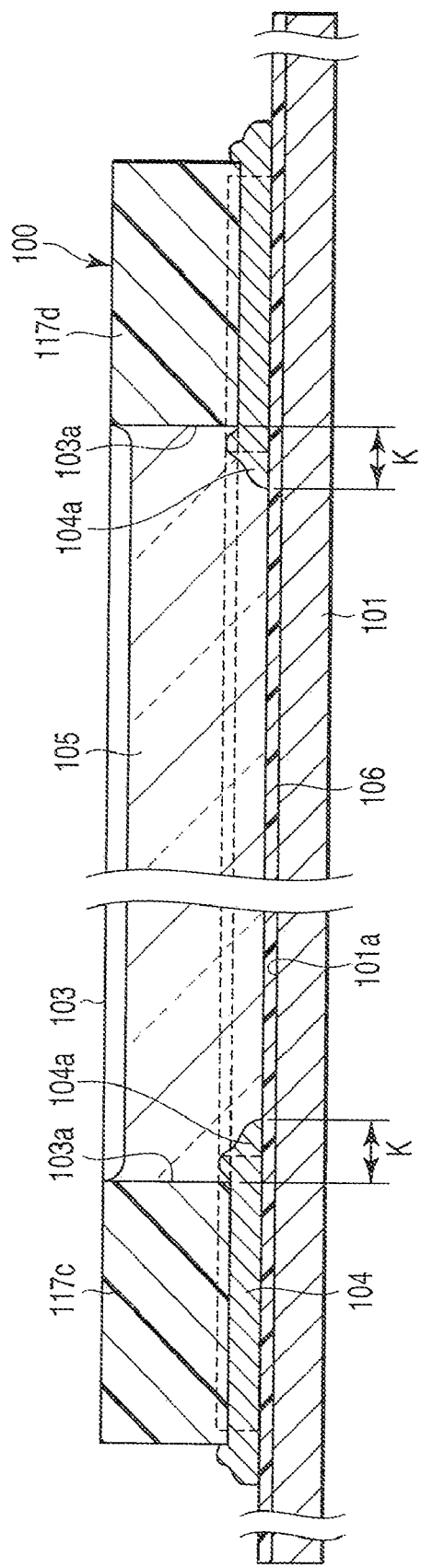
FIG. 16 is a cross-sectional view taken along line F16-F16 in FIG. 15.
Figure 17:
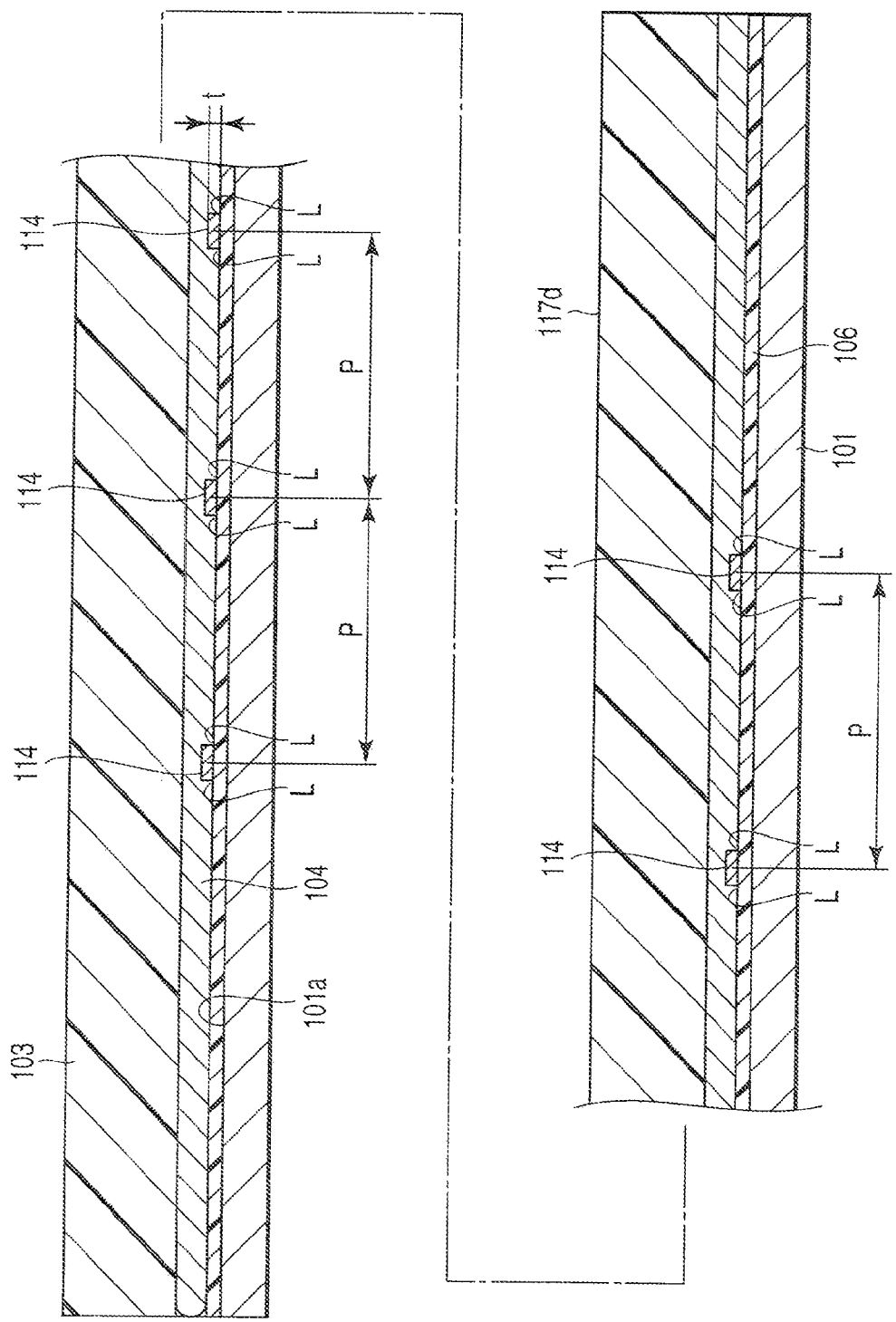
FIG. 17 is a cross-sectional view taken along line F17-F17 in FIG. 14.

FIG. 15 to FIG. 17 shows an illumination device 100 according to a seventh embodiment of the present invention. The illumination device 100 includes a base board 101, a plurality of semiconductor light-emitting elements 102, a reflector 103, an adhesive member 104 and a sealing member 105.

The base board 101 is formed in a rectangular shape in order to obtain a light emission area that is required by the illumination device 100. The material of the base board 101 should preferably be a metal with good heat radiation properties, such as copper. The base board 101 has a front surface 101a. An insulator 106 is stacked on the front surface 101a. The insulator 106 is formed of, e.g. a white synthetic resin. The thickness of the base board 101 including the insulator 106 is, e.g. 0.5 mm.

A conductor 108 is formed on the insulator 106. The conductor 108 includes a plurality of conductor strings 109. The conductor strings 109 extend in the longitudinal direction of the base board 101 and are disposed in parallel with an interval therebetween. The interval of the conductor strings 109 is, e.g. 3.0 mm.

Each of the conductor strings 109 includes a plurality of conductor portions 110 and a pair of terminal portions 111. The conductor portions 110 and the terminal portions 111 are formed by stacking silver plating layers on the copper surface. As shown in FIG. 17, the thickness t of the conductor portion 110 is set at 20 µm or less, preferably 14 µm. The conductor portions 110 are arranged in line at intervals of, e.g. 3.0 mm in the longitudinal direction of the base board 101.

One of the terminal portions 111 is continuous with the conductor portion 110 that is located at one end of each conductor string 109, and is located at one end in the longitudinal direction of the base board 101. The other terminal portion 111 is continuous with the conductor portion 110 that is located at the other end of each conductor string 109, and is located at the other end in the longitudinal direction of the base board 101. Accordingly, the pair of terminal portions 111 are spaced apart in the longitudinal direction of the conductor string 109, and the terminal portions 111 are arranged at intervals of, e.g. 3.0 mm in a direction perpendicular to the longitudinal direction of the base board 2.

As shown in FIG. 15, each terminal portion 111 includes a land part 113 and a connection part 114. The land part 113 is a part to which a power cable that is connected to an external power supply is soldered, and the land part 113 has a strip shape extending in the longitudinal direction of the base board 101. The width of the land part 113 is, e.g. 1.0 mm.

The connection part 114 is formed integral with the land part 113, and extends from the land part 113 toward the conductor portion 110. The width of the connection part 114 is, e.g. 0.1 mm to less than 1.0 mm, preferably 0.5 mm, and is less than the width of the land part 113. An end portion of the connection part 114, which is opposite to the land part 113, functions also as a conductor portion 110 that is located at one end and the other end of the conductor string 109. Accordingly, the width of the connection part 114 is equal to the width of the conductor portion 110. Moreover, the interval P between the connection parts 114, which neighbor in the direction perpendicular to the longitudinal direction of the base board 101, should preferably be 0.2 mm or more, and is 2.5 mm in the present embodiment.

Like the first embodiment, a double-wire type blue LED chip is used as each semiconductor light-emitting element 102. As shown in FIG. 15, the semiconductor light-emitting element 102 is bonded to the distal end face of a columnar projection portion 115 which projects from the base board 101. The projection portion 115 penetrates the insulator 106 and projects above the insulator 106, and is located between neighboring conductor portions 110. Further, like the first embodiment, the projection portion 115 is formed to become gradually thicker from the distal end face, on which the semiconductor light-emitting element 102 is bonded, toward the base board 101. Accordingly, the outer peripheral surface of the projection portion 115 has a taper shape which flares toward the base board 101 so as to reflect light, which is emitted from the semiconductor light-emitting element 102, in a direction opposite to the base board 101.

The semiconductor light-emitting element 102 is electrically connected to the neighboring conductor portions 110 via a pair of bonding wires 116. As a result, a plurality of semiconductor light-emitting elements 102 are connected in series in each of the conductor strings 109 of the conductor 108.

The reflector 103 is an example of a frame member. The reflector 103 is formed, for example, in a rectangular frame shape and surrounds all semiconductor light-emitting elements 102 as a group. In other words, the reflector 103 is not associated with the individual semiconductor light-emitting elements 102, but is configured as a structural element which is common to all semiconductor light-emitting elements 102.

The reflector 103 is formed of, e.g. a synthetic resin, and its inner peripheral surface is formed as a light reflective surface 103a. In the present embodiment, in order to obtain the light reflective surface 103a, a white filler, such as magnesium oxide, is mixed in the resin, of which the reflector 103 is to be formed. The thickness of the reflector 103 is, e.g. 1.0 mm.

The reflector 103 includes first to fourth edge portions 117a, 117b, 117c and 117d. The first edge portion 117a extends along one longitudinal side edge of the base board 101. The second edge portion 117b extends along the other longitudinal side edge of the base board 101. The third edge portion 117c extends between one end of the first edge portion 117a and one end of the second edge portion 117b. The fourth edge portion 117d extends between the other end of the first edge portion 117a and the other end of the second edge portion 117b. Accordingly, the third and fourth edge portions 117c and 117d extend in a direction perpendicular to the longitudinal direction of the base board 101, and cross over the terminal portions 111 of the conductor strings 109. To be more specific, the third and fourth edge portions 117c and 117d of the reflector 103 cross over the connection parts 114 of the terminal portions 111. Thereby, all the conductor portions 110 of the conductor 108 are located within the region surrounded by the reflector 103, and all the land parts 113 of the conductor 108 are located outside the reflector 103.

As shown in FIG. 16 and FIG. 17, the adhesive member 104 bonds the reflector 103 to the insulator 106 of the base board 101. The adhesive member 104 is formed in a rectangular shape and has a size corresponding to the reflector 103. The adhesive member 104 is formed by impregnating a frame-shaped base with a thermosetting adhesive resin. A silicone resin is usable as the adhesive resin. The thickness of the adhesive member 104 is greater than that of the conductor portion 110 and is less than that of the reflector 103. Specifically, the thickness of the adhesive member 104 is, e.g. 0.15 mm. The width of the adhesive member 104 is equal to, or slightly less than, the width of each of the first to fourth edge portions 117a, 117b, 117c and 117d.

The adhesive member 104 is attached in advance to that surface of the reflector 103, which faces the insulator 106, and is formed integral with the reflector 103. The reflector 103 with the adhesive member 104 is placed on the base board 101 to which the semiconductor light-emitting elements 102 are bonded, and is pressed toward the base board 101. In this state, the base board 101 is passed into a heating furnace and the adhesive member 104 is thermally cured. Thereby, the reflector 103 is attached to the insulator 106 of the base board 101.

The adhesive member 104, when heated, is clamped between the reflector 103 and the insulator 106 of the base board 101 and is deformed. Thereby, part of the adhesive resin, which is contained in the base, protrudes to the inside and outside of the reflector 103. As shown in FIG. 16, protrusion portions 104a of the adhesive resin cover at least corner portions which are defined by the inner surfaces of the third and fourth edge portions 117c and 117d of the reflector 103 and the surface of the insulator 106. Furthermore, the protrusion portions 104a extend continuously along the inner surfaces of the third and fourth edge portions 117c and 117d in the direction perpendicular to the longitudinal direction of the base board 101. The protrusion portions 104a are naturally formed when the adhesive member 104 is pressed between the reflector 103 and the insulator 106. Thus, the formation of the protrusion portions 104a is not time-consuming, and this is advantageous in that the reflector 103 is easily attached.

The length K of protrusion of the protrusion portion 104a from the inner surface of each of the third and fourth edge portions 117c and 117d should preferably be set at 0.2 mm or less. The reason is as follows.

For example, in the case where the adhesive resin is colored in a color other than white, there is a concern that light emitted from the semiconductor light-emitting element 102 is absorbed by the protrusion portion 104a of the adhesive resin. However, since the length K of protrusion of the protrusion portion 104a is 0.2 mm or less and is very small, the area of the protrusion portion 104a is very small. Accordingly, the light absorption function of the protrusion portion 104a becomes ignorable, and it is possible to prevent the protrusion portion 104a from hindering efficient extraction of light.

In addition, when wire bonding is applied to the semiconductor light-emitting element 102 after the reflector 103 is attached to the base board 102, interference between the bonding tool and the protrusion portion 104a of the adhesive resin can be avoided. Thus, the bonding tool is prevented from being stained and damaged by the adhesive resin.

As shown in FIG. 16, the sealing member 105 is filled in the region surrounded by the reflector 103. The sealing member 105 covers all the semiconductor light-emitting elements 102 located inside the reflector 103, insulator 106 and bonding wires 116. Further, the sealing member 105 covers the protrusion portion 104a of the adhesive resin, which is located inside the reflector 103.

The sealing member 105 is formed of, e.g. a thermosetting silicone resin. The silicone resin is filled inside the reflector 103 and is subjected to heat treatment and solidified.

A phosphor is mixed in the silicone resin, of which the sealing member 105 is formed. The phosphor is mixed, as a preferable example, in the sealing member 105 in a substantially uniformly dispersed state. In the present embodiment, use is made of the phosphor which wavelength-convert blue primary light that is emitted from the semiconductor light-emitting element 102 to yellow secondary light having a different wavelength. By the mixing of the two complementary colors, white light emitted from the illumination device 100.

According to the seventh embodiment, the heat of the semiconductor light-emitting element 102 can be let to escape directly to the projection portion 115 of the base board 101, and the decrease in light emission efficiency due to the temperature rise of the semiconductor light-emitting element 102 can be suppressed. Besides, the light traveling from the semiconductor light-emitting element 102 toward the base board 101 is reflected, and thereby the light can efficiently be extracted.

In the seventh embodiment, by filling the sealing member 105 inside the reflector 103 that is attached to the base board 101, all the semiconductor light-emitting elements 102, which are bonded to the projection portions 115 of the base board 101, and the bonding wires 116 can be sealed by the sealing member 105 at a time.

Moreover, the adhesive member 104, which bonds the reflector 103 to the insulator 106 of the base board 101, is formed by impregnating the base with the adhesive resin. Thus, a work of coating an adhesive to the reflector 103 is needless, and there is no need to manage the amount of coating of the adhesive. Therefore, the work that is needed for the fabrication of the illumination device 100 can be simplified, and the manufacturing cost can be reduced.

According to the seventh embodiment, the width of the land part 113 of each terminal portion 111 of the conductor 108 is greater than the width of the connection part 114 thereof. Thus, when a power cable is soldered to the land part 113, a sufficient contact area can be secured between the land part 113 and the power cable. Therefore, the power cable can be connected to the land part 113 in an electrically stable state.

Besides, the width of the connection part 114 of each of the terminal portions 111, over which the third and fourth edge portions 117c and 117d of the reflector 103 cross, is less than the width of the land part 113 of each terminal portion 111. Thereby, the pitch P between neighboring connection parts 114 can be increased. In other words, even in the case where the pitch between neighboring conductor strings 109 is reduced as small as possible, the pitch P between the connection parts 114 can be increased.

As a result, when the reflector 103 is pressed toward the base board 101, that part of the adhesive member 104, which extends along the third and fourth edge portions 117c and 117d of the reflector 103, deforms and easily enter between the neighboring connection parts 114. In the present embodiment, since the interval between the neighboring connection parts 114 is set at 2.5 mm, the adhesive member 104 more easily enter between the neighboring connection parts 114.

Moreover, at the initial stage of heat treatment, the adhesive member 104 temporarily softens. Thereby, the adhesive member 104 easily enters every part and corner between the neighboring connection parts 114. Besides, in the present embodiment, since the thickness of each conductor string 109 including connection parts 114 is 14 μm and is small, the surface of the insulator 106 including the conductor 108 is flat with little roughness. Accordingly, the adhesive member 104 can easily come in close contact with the surface of the insulator 106, and the adhesive member 104 can easily enter every part and corner between the neighboring connection parts 114.

As a result, as shown in FIG. 17, corner parts L, which are defined by the surface of the insulator 106 and the side surfaces of the connection parts 114 standing on the surface of the insulator 106, can surely be filled with the adhesive member 104. Therefore, minute gaps, which communicate the inside and outside of the reflector 103, are prevented from occurring at the corner parts L.

Besides, the adhesive member 104 covers the corner parts L. Thus, even if minute gaps occur at the corner parts L, the gaps can be sealed with the adhesive member 104 and prevented from communicating with the inside of the reflector 103.

Hence, when the non-solidified silicone resin, which is filled inside the reflector 103, is subjected to heat treatment to form the sealing member 105, the non-solidified silicone resin is prevented from leaking to the outside of the reflector 103 through the corner parts L. Thereby, no silicone resin is wasted, and the sealing member 105 can be formed of a predetermined amount of silicone resin.

Furthermore, when the non-solidified silicone resin is heated, the adhesive 104 can shield flow of air, which remains at the corner part L and expands, to the inside of the reflector 103. Therefore, the air remaining at the corner part L is prevented from becoming bubbles and staying in the sealing member 105, and the degradation in insulation performance of the sealing member 105 can be prevented.

Figure 18:
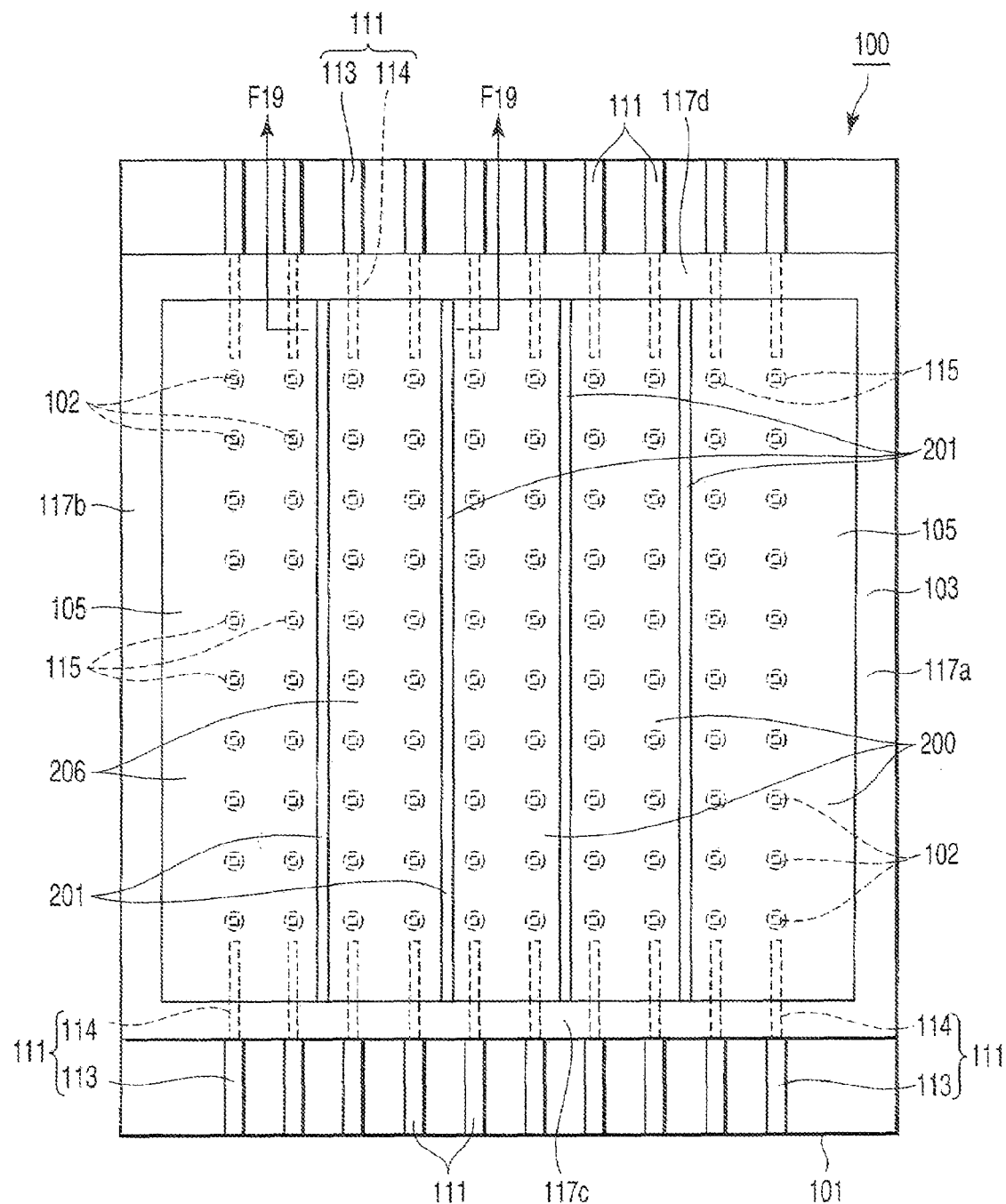
FIG. 18 is a plan view of an illumination device according to an eighth embodiment of the invention.
Figure 19:
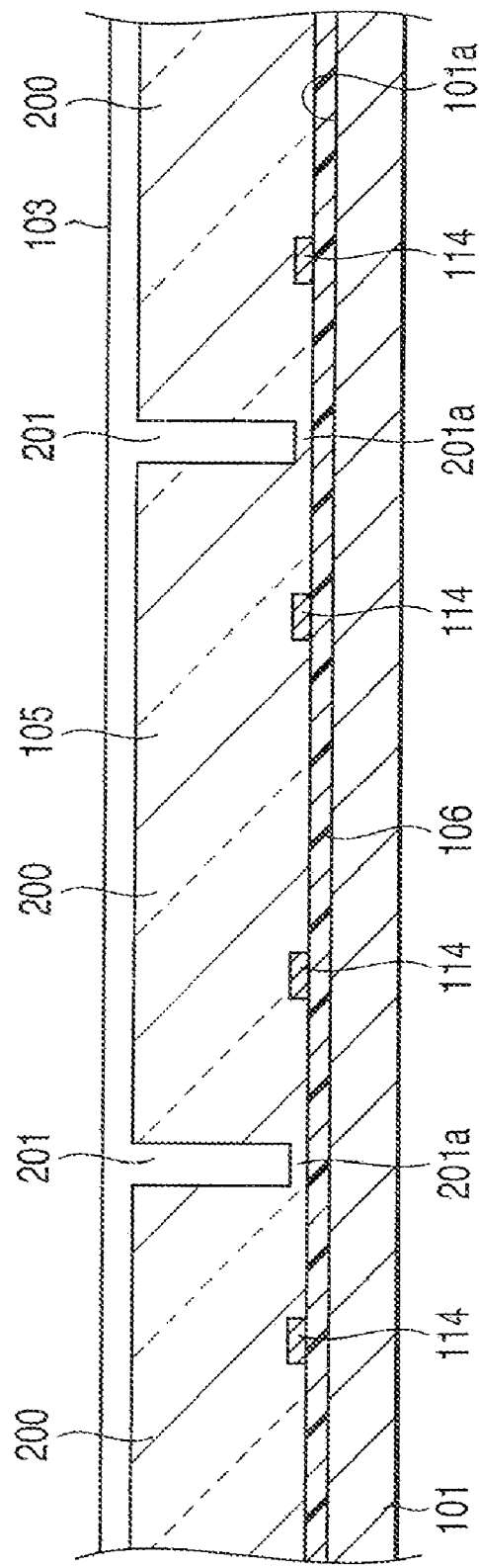
FIG. 19 is a cross-sectional view taken along line F19-F19 in FIG. 18.

FIG. 18 and FIG. 19 show an eighth embodiment of the present invention.

The eighth embodiment differs from the seventh embodiment with respect to the structure of the sealing member 105. In the other respects, the structure of the illumination device 100 of the eighth embodiment is basically the same as that of the illumination device 100 of the seventh embodiment. Thus, in the eighth embodiment, the structural parts common to those in the seventh embodiment are denoted by like reference numerals, and a description thereof is omitted.

As shown in FIG. 18, the sealing member 105 that covers the semiconductor light-emitting elements 102 includes a plurality of light emission sections 200. Each light emission section 200 has a strip shape extending in the longitudinal direction of the base board 101, and the light emission sections 200 are arranged in the direction perpendicular to the longitudinal direction of the base board 101. Each light emission section 200 includes two juxtaposed strings of semiconductor light-emitting elements 102. Hence, each light emission section 200 is made to emit, for example, white light, by the light radiated from the two strings of semiconductor light-emitting elements 102.

A plurality of grooves 201 are formed in the surface of the sealing member 105. The grooves 201 extend in the longitudinal direction of the base board 101 and are arranged in parallel at intervals in the direction perpendicular to the longitudinal direction of the base board 101. The grooves 201 are positioned at boundaries between the neighboring light emission sections 200. A bottom part 201a of each groove 201 lies between the neighboring light emission sections 200.

The heat that is produced by the semiconductor light-emitting elements 102 conducts to the base board 101 which supports the semiconductor light-emitting elements 102, and to the sealing member 105 which covers the semiconductor light-emitting elements 102. The thermal expansion coefficient of the sealing member 105 differs from that of the base board 101 due to the difference in material. In general, thermal expansion/contraction tends to more easily occur in the sealing member 105 than in the base board 101. Accordingly, if the sealing member 105 expands/contracts due to the thermal effect of the semiconductor light-emitting elements 102, this may lead to warp or distortion of the base board 101 to which the sealing member 105 is attached.

According to the eighth embodiment, the grooves 201, which divide the neighboring light emission sections 200, are formed in the surface of the sealing member 105. The grooves 201 absorb expansion/contraction force due to the thermal expansion or thermal contraction of the sealing member 105.

Hence, even when the sealing member 105 receives the heat of the semiconductor light-emitting elements 102 and expands/contracts, the expansion/contraction of the sealing member 105 can be absorbed within the sealing member 105. Therefore, the expansion/contraction force of the sealing member 105 is hardly transmitted to the base board 101, and the warp and distortion of the base board 101 can be prevented.

Moreover, the plural light emission sections 200 of the sealing member 105 are divided by the grooves 201. Thus, the expansion/contraction force, which occurs in each light emission section 200, hardly affects the neighboring light emission sections 200, and does not increase the warp or distortion of other light emission sections 200. Therefore, non-uniformity in color between the light emission sections 200 can be reduced and suppressed.

The sealing member 105 may be formed by, for example, injection molding. Thereby, the non-solidified resin, of which the sealing member 105 is to be formed, is filled in the mold, and thus the thickness of the light emission sections 200 becomes uniform. Furthermore, since the grooves 201 having bottom parts 201a are formed between the light emission sections 200, deformation of the sealing member 105 due to blow-hole can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An illumination device comprising:
a base hoard having heat radiation properties, the base board including a surface and a plurality of projection portions, each projection portion having a distal end face and an outer peripheral surface, the distal end face being covered with a light reflective layer, the outer peripheral surface being flared from the distal end face towards the surface of the base board;
an insulator formed on the surface of the base board, the insulator having a plurality of through holes through which the projection portions penetrate;
a conductor formed on the insulator;
a plurality of semiconductor light-emitting elements which are bonded by light-transmissive bonding materials to the light reflective layers formed on the distal end faces of the projection portions of the base board;
connection members which electrically connect the conductor and the semiconductor light-emitting elements; and
a light-transmissive sealing member which covers the insulator, the projection portions, the semiconductor light-emitting elements and the connection members.

2. The illumination device according to claim 1, further comprising a resist layer, stacked on the insulator and the conductor, and having a plurality of openings in which the semiconductor light-emitting elements and connection parts between the connection members and the conductor are located, and the sealing member individually sealing the openings.

3. The illumination device according to claim 1, wherein each of the through holes has a diameter which is greater than the diameter of the projection portions, an annular gap being formed between each of the through holes and the outer peripheral surface of the associated projection portion; the illumination device further comprising an adhesive which bonds the insulator to the surface of the base board, a part of the adhesive protruding into the annular gap.

4. The illumination device according to claim 3, wherein a side light reflective layer is formed on the outer peripheral surface of each projection portion, the side light reflective layer is continuous with the light reflective layer and with a part of the adhesive that protrudes into the annular gap, and the sealing member includes a phosphor excited by a light emitted from the semiconductor light-emitting elements.

5. The illumination device according to claim 4, wherein a dimension of protrusion of the adhesive into the annular gap is 0.2 mm or less.

6. The illumination, device according to claim 3, wherein a light reflectance of the insulator is different from a light reflectance of the adhesive.

7. The illumination device according to claim 6, wherein the adhesive is transparent.

8. An illumination device comprising:
    a base board having heat radiation properties, the base board including a surface and a plurality of projection portions formed to become gradually thicker from its ends toward the surface of the base board;
    an insulator formed on the surface of the base board;
    a conductor formed on the insulator;
    a plurality of semiconductor light-emitting elements which are mounted on the projection portions of the base board;
    connection members which electrically connect the conductor and the semiconductor light-emitting elements;
    a light-transmissive sealing member which covers the insulator, the projection portions, the semiconductor light-emitting elements and the connection members;
    a frame member which surrounds the semiconductor light-emitting elements; and
    an adhesive which contains a thermosetting adhesive resin and is interposed between the frame member and the insulator, the adhesive bonding the frame member to the insulator, and the sealing member being filled in a region which is surrounded by the frame member.

9. The illumination device according to claim 8, wherein the conductor includes a plurality of terminal portions arranged at intervals, each of the terminal portions includes a land part for power supply and a connection part connecting the land part and the conductor, the connection part has a smaller width than the land part, and the frame member crosses over the connection parts of the terminal portions.

10. The illumination device according to claim 9, wherein a width of the connection part is in a range of between 0.1 mm to less than 1.0 mm, and an interval between neighboring said connection parts is 0.2 mm or more.

11. The illumination device according to claim 9, wherein a thickness of the conductor is 20 µm or less.

12. The illumination device according to claim 8, wherein the adhesive resin includes protrusion portions protruding inside the frame member, the protrusion portions cover corner parts defined by the insulator and portions of the frame member crossing over the connection parts, and the sealing member covers the protrusion portions.

13. The illumination device according to claim 8, wherein the sealing member includes a plurality of light emission sections which are made to emit light by the light radiated from the semiconductor light-emitting elements, and grooves located between the light emission sections.

14. The illumination device according to claim 13, wherein each of the grooves includes a bottom part which connects neighboring the light emission sections.

15. An illumination device comprising:
    a base board having heat radiation properties, the base board having a surface and a plurality of projection portions projecting from the surface, each projection portion having a distal end face and an outer peripheral surface, wherein the distal end face and the outer peripheral surface of each of the projection portions are light reflective, each of the projection portions is formed such that the outer peripheral surface flares from the distal end face towards the surface of the base board;
    an insulator formed on the surface of the base board, the insulator having a plurality of through holes through which the projection portions penetrate, each of the through holes having a diameter which is greater than the diameter of the projection portions, an annular gap being formed between each of the through holes and the outer peripheral surface of the associated projection portion;
    an adhesive which bonds the insulator to the surface of the base board, a part of the adhesive protruding to the annular gap;
    a conductor formed on the insulator;
    a plurality of semiconductor light-emitting elements which are bonded to the distal end faces of the projection portions by light-transmissive bonding materials;
    connection members which electrically connect the conductor and the semiconductor light-emitting elements; and
    a light-transmissive sealing member which covers the insulator, the projection portions, the semiconductor light-emitting elements and the connection members.

* * * * *